US012772898B2

(12) United States Patent
Duca

(10) Patent No.: US 12,772,898 B2
(45) Date of Patent: Oct. 20, 2026

(54) SEMICONDUCTOR PACKAGING WITH TRANSPARENCY AND METHOD OF MANUFACTURING THE SAME

(71) Applicant: STMICROELECTRONICS (MALTA) LTD, Kirkop (MT)

(72) Inventor: Roseanne Duca, Ghaxaq (MT)

(73) Assignee: STMICROELECTRONICS (MALTA) LTD, Kirkop (MT)

( * ) Notice: Subject to any disclaimer, the term of this patent is extended or adjusted under 35 U.S.C. 154(b) by 537 days.

(21) Appl. No.: 18/355,966

(22) Filed: Jul. 20, 2023

(65) Prior Publication Data

US 2024/0038610 A1 Feb. 1, 2024

Related U.S. Application Data

(60) Provisional application No. 63/392,667, filed on Jul. 27, 2022.

(51) Int. Cl.

| | |
|---|---|
| ***H10W 76/15*** | (2026.01) |
| ***H10W 74/01*** | (2026.01) |
| ***H10W 74/47*** | (2026.01) |
| ***H10W 90/00*** | (2026.01) |
| *H10W 72/00* | (2026.01) |

(52) U.S. Cl.

CPC ....... *H10W 74/476* (2026.01); *H10W 74/014* (2026.01); *H10W 76/15* (2026.01); *H10W 90/00* (2026.01); *H10W 72/075* (2026.01); *H10W 72/884* (2026.01); *H10W 90/734* (2026.01); *H10W 90/754* (2026.01)

(58) Field of Classification Search

CPC ... H01L 23/296; H01L 21/561; H01L 23/053; H01L 24/48; H01L 24/85; H01L 25/0655; H01L 25/50; H01L 24/32; H01L 24/73; H01L 2224/32225; H01L 2224/48225; H01L 2224/73265; H01L 2224/85; H01L 24/97; H10F 77/50

See application file for complete search history.

(56) References Cited

U.S. PATENT DOCUMENTS

| | | | | |
|---|---|---|---|---|
| 4,763,407 | A * | 8/1988 | Abe ...................... | H10W 74/01 29/827 |
| 9,142,528 | B2 | 9/2015 | Ng et al. | |
| 11,094,722 | B2 | 8/2021 | Watanabe et al. | |

(Continued)

*Primary Examiner* — Elias Ullah

(74) *Attorney, Agent, or Firm* — Seed Intellectual Property Law Group LLP

(57) ABSTRACT

A method of manufacturing a semiconductor package with an one or more dice present within a transparent resin, which may be an epoxy-based transparent resin or a silicone-based transparent resin, includes coupling the one or more dice to respective surfaces of a plurality of base portions of a panel substrate. Each one of the respective surfaces is between ones of a plurality of walls of the panel substrate that protrude from the respective surfaces of the panel substrate. A plurality of wirebonds may be formed to provide electrical pathways between the one or more dice and conductive structures of the panel substrate accessible at the respective surfaces of the panel substrate. A transparent resin may be formed to fill recesses or cavities between ones of the plurality of walls, and the panel substrate may then be singulated along the plurality of walls.

20 Claims, 11 Drawing Sheets

(56) References Cited

U.S. PATENT DOCUMENTS

| | | | |
|---|---|---|---|
| 11,264,778 | B2 | 3/2022 | Godfrey |
| 2010/0091633 | A1 | 4/2010 | FuruyashikiI et al. |
| 2022/0085571 | A1 | 3/2022 | Chen et al. |

* cited by examiner

SEMICONDUCTOR PACKAGING WITH TRANSPARENCY AND METHOD OF MANUFACTURING THE SAME

BACKGROUND

Technical Field

The present disclosure is directed to semiconductor packages with transparent portions or structures as well as methods of manufacturing the semiconductor packages with transparent portions or structures.

Description of the Related Art

Generally, conventional semiconductor packages that include sensors whose operation is to detect radiation (e.g., UV sensors, time-of-flight (TOF) sensors, etc.) are assembled such that the radiation sensors are in a transparent medium (e.g., transparent resin) with specific transparency values that allow specific wavelengths to pass through the transparent medium to be received by the radiation sensors. Generally, the transparent medium (e.g., transparent resin) has a high coefficient of thermal expansion (CTE) and a low Young's modulus that causes the transparent medium to be susceptible to thermomechanical stresses and strains. In these conventional semiconductor packages, the transparent medium may be an epoxy-based transparent resin or may be a silicone-based transparent resin.

Epoxy-based transparent resins and silicone-based transparent resins each come with their own challenges. For example, when utilizing an epoxy-based transparent resin, warpage may occur during manufacturing processes resulting in thermomechanical and electrical defects occurring within the conventional semiconductor packages resulting in high yield loss as these thermomechanical and electrical defects may result in the conventional semiconductor packages being out-of-tolerance or having a shortened usable life span. Alternatively, when utilizing a silicone-based transparent resin, cosmetic problems and issues may occur during manufacturing processes that may result in the conventional semiconductor packages appearing to be defective when in actuality the conventional semiconductor packages with the cosmetic problems and issues may be usable and within selected tolerances.

BRIEF SUMMARY

The present disclosure is directed to embodiments of semiconductor packages that overcome the challenges and difficulties as set forth above, and is directed to embodiments of methods of manufacturing the embodiments of the semiconductor packages that overcome the challenges and difficulties as set forth above.

In at least one embodiment of a semiconductor package, a base substrate includes a base portion and a plurality of wall portions that extend outward from a surface of the base portion. One or more dice or integrated circuits are present on the surface of the base portion of the base substrate. The one or more dice or integrated circuits may be radiation or optical sensors (e.g., UV light sensors, time-of-flight (TOF) sensors, ambient light sensors, light emitter, light receiver, etc.). In some embodiments, at least one wirebond may have a first end coupled to a die of the one or more dice and a second end coupled to a conductive structure accessible at the surface of the base portion. A transparent resin is present between the plurality of wall portions and the transparent resin covers the one or more dice and the at least one wirebond such that the one or more dice and the at least one wirebond is encased within the transparent resin. In some embodiments, the transparent resin is a silicone-based transparent resin, and, in some embodiments, the transparent resin is an epoxy-based transparent resin. The silicone-based transparent resin is generally softer, more pliable, and more malleable relative to the epoxy-based resin. The situation and application in which the semiconductor package is to be utilized may affect whether the transparent resin is the epoxy-based transparent resin or is the silicone-based transparent resin.

In at least one embodiment of a method of manufacturing the at least one embodiment of the semiconductor package, a plurality of dice or integrated circuits are positioned within a plurality of recesses in a panel substrate, between a plurality of walls of the panel substrate, and on a plurality of surfaces of the panel substrate. Each one of the plurality of surfaces of the panel substrate is within a corresponding recess of the plurality of recesses. Once the plurality of dice are present on the plurality of surfaces of the panel substrate and in the plurality of recesses, a plurality of wirebonds are formed such that the plurality of dice are coupled to conductive structures of the panel substrate accessible at the plurality of surfaces of the panel substrate. Once the plurality of wirebonds are formed, a transparent resin is formed within the plurality of recesses such that the transparent resin covers the plurality of wirebonds, covers the plurality of die, and at least partially fills recesses or cavities in the panel substrate. The plurality of walls constrain and limit expansion of the transparent resin, which may be an epoxy-based transparent resin or a silicone-based transparent resin. After the transparent resin is formed within the plurality of recesses in the panel substrate, the panel substrate is singulated along and through the plurality of walls. The singulation of the panel substrate forms multiple ones of the at least one embodiment of the semiconductor package.

BRIEF DESCRIPTION OF THE SEVERAL VIEWS OF THE DRAWINGS

For a better understanding of the embodiments, reference will now be made by way of example to the accompanying drawings. In the drawings, identical reference numbers identify the same or similar elements or acts unless the context indicates otherwise. The sizes and relative proportions of the elements in the drawings are not necessarily drawn to scale. For example, some of these elements may be enlarged and positioned to improve drawing legibility.

DETAILED DESCRIPTION

Figure 1:
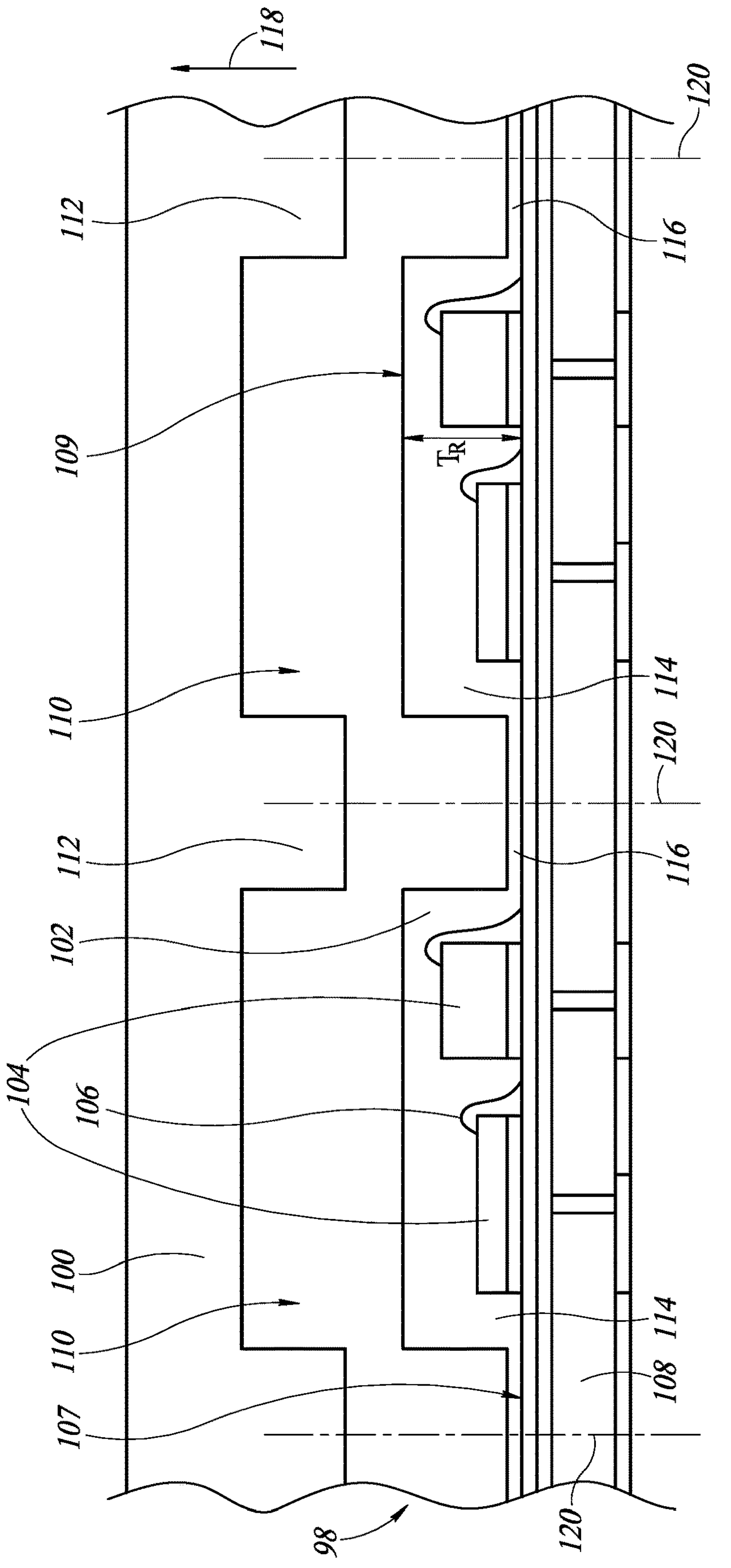
FIG. 1 is a side view of an example of a package assembly panel after a customized molding tool has been removed from the package assembly panel.

In the following description, certain specific details are set forth in order to provide a thorough understanding of various embodiments of the disclosure. However, one skilled in the art will understand that the disclosure may be practiced without these specific details. In other instances, well-known structures associated with electronic components, packages, and semiconductor fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second, third, etc., does not necessarily imply a ranked sense of order, but rather may only distinguish between multiple instances of an act or a similar structure or material.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The terms "top," "bottom," "upper," "lower," "left," and "right," are used for only discussion purposes based on the orientation of the components in the discussion of the figures in the present disclosure as follows. These terms are not limiting as to the possible positions explicitly disclosed, implicitly disclosed, or inherently disclosed in the present disclosure.

The term "substantially" is used to clarify that there may be slight differences and variations when a package is manufactured in the real world, as nothing can be made perfectly equal or perfectly the same. In other words, "substantially" means and represents that there may be some slight variation in actual practice and instead is made or manufactured within selected tolerances.

As used in this specification and the appended claims, the singular forms "a," "an," and "the" include plural referents unless the content clearly dictates otherwise.

The present disclosure is directed to embodiments of semiconductor packages and methods of manufacturing the embodiments of the semiconductor packages. For example, the methods of manufacturing the embodiments of the semiconductor packages of the present disclosure are adapted such that warpage that occurs during manufacturing of the embodiments of the semiconductor packages is minimized or prevented by utilizing a panel substrate that includes a plurality of walls that protrude from a plurality of base portions of the panel substrate. Minimizing or preventing the warpage during manufacturing results in the embodiments of the packages being more robust, reducing the likelihood of defects from the warpage as compared to conventional semiconductor packages.

Figure 2A:
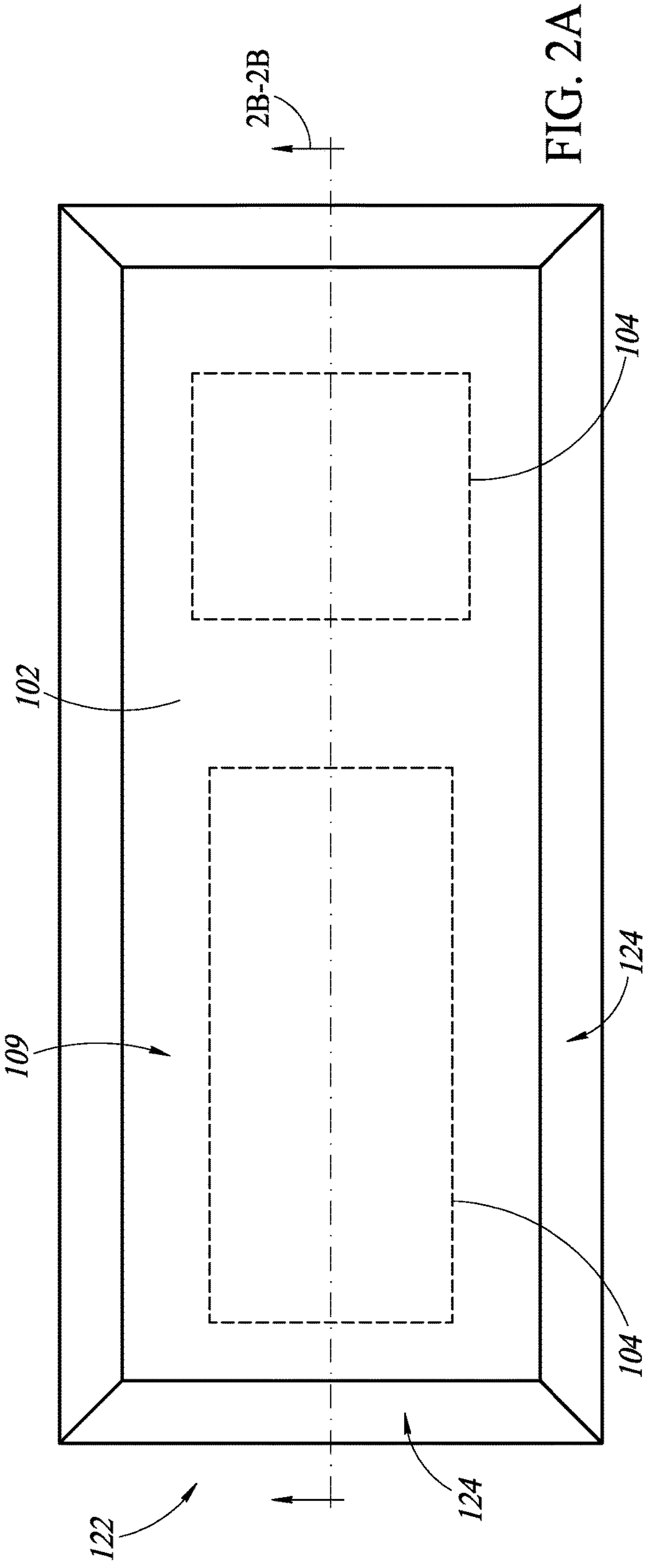
FIG. 2A is a top plan view of an example of a semiconductor package formed by singulating the package assembly panel as shown in FIG. 1.
Figure 2B:
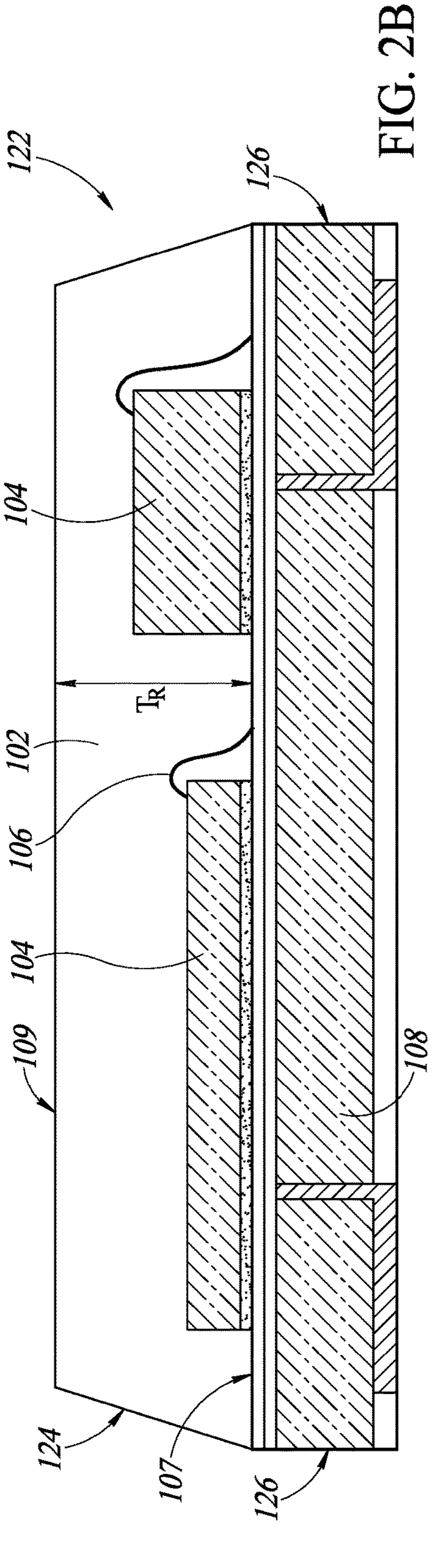
FIG. 2B is a cross-sectional view of the example of the semiconductor package taken along line 2B-2B as shown in FIG. 2A.

FIG. 1 is a side view of a step in a method of manufacturing an example of a package assembly panel 98 in forming an example of a semiconductor package 122 as shown in FIGS. 2A and 2B of the present disclosure. In the step as shown in FIG. 1, a mold structure 100, which may be referred to as a chocolate bar mold, is being removed from a transparent resin 102 of the package assembly panel 98 that was previously formed on the plurality of dice 104, on the plurality of wirebonds 106, and on a surface 107 of a substrate 108 of the package assembly panel 98. The transparent resin 102 as shown in FIG. 1 may have been formed by utilizing a transfer mold process, a compression mold process, or some other suitable type of manufacturing technique to form the transparent resin 102 with the structure as shown in FIG. 1.

The chocolate bar mold 100 includes a plurality of recesses 110 and a plurality of protrusions 112. Each one of the plurality of recesses 110 is adjacent to ones of the plurality of protrusions 112, and each one of the plurality of protrusions 112 is adjacent to ones of the plurality of recesses 110. The transparent resin 102 includes a plurality of first portions 114 and a plurality of second portions 116, and the plurality of first portions 114 are thicker than the plurality of second portions 116. The plurality of first portions 114 correspond to the plurality of recesses 110 of the chocolate bar mold 100 and the plurality of second portions 116 correspond to the plurality of protrusions 112 of the chocolate bar mold 100. For example, when a transfer mold process is utilized to form the transparent resin 102, the chocolate bar mold 100 is brought into close proximity with the surface 107 of the substrate 108 and the transparent resin 102 is flowed through areas between respective surfaces of the chocolate bar mold 100 and the surface 107 of the substrate 108. After the transparent resin 102 has been formed including the plurality of first portions 114 and the plurality of second portions 116, the chocolate bar mold 100 is moved away from the surface 107 of the substrate 108 in a direction represented by an arrow 118 as shown in FIG. 1. Once the chocolate bar mold 100 has been removed from the transparent resin 102, the plurality of first portions 114 and the plurality of second portions 116 are exposed and structured as shown in FIG. 1. After the chocolate bar mold 100 has been removed from the transparent resin 102, the transparent resin 102 and the substrate 108 of the package assembly panel 98 are singulated along lines 120 as shown in FIG. 1 to form the example of the semiconductor package 122 as shown in FIGS. 2A and 2B. The lines 120 are along the second portions 116 of the transparent resin 102. The transparent resin 102 and the substrate 108 of the package assembly panel 98 may be singulated by a singulation tool, which may be a saw, a laser, or some other suitable type of singulation tool. The plurality of first portions 114 have a resin thickness T R that extends from the surface 107 to respective surfaces 109 of the plurality of first portions 114.

FIG. 2A is a top plan view of an example of the semiconductor package 122, and FIG. 2B is a cross-sectional view taken along line 2B-2B as shown in FIG. 2A. The transparent resin 102 of the semiconductor package 122 includes a plurality of inclined sidewalls or surfaces 124 that are transverse and inclined with respect to the surface 107 of the substrate 108. The substrate 108 includes a plurality of sidewalls 126 that are transverse to the surface 107 of the substrate 108.

Generally, in the manufacture of the example of the semiconductor package 122 that includes the plurality of dice 104 whose operation may be to detect radiation (e.g., UV sensors, time-of-flight (TOF) sensors, etc.) through the transparent resin 102. In this example of the semiconductor package 122, the transparent resin 102 may be an epoxy-based transparent resin or may be a silicone-based transparent resin. The epoxy-based transparent resins and the silicone-based transparent resins each come with their own challenges.

For example, utilizing an epoxy-based transparent resin to manufacture the example of the semiconductor package 122 at the panel level (e.g., package assembly panel 98) tends to cause thermomechanical issues due to the high coefficient of thermal expansion (CTE) of the epoxy-based transparent resin 102 in combination with a moderate Young's modulus of the epoxy-based transparent resin 102. The thermomechanical issues generally occur due to a CTE mismatch between the substrate 108 on which the epoxy-based transparent resin 102 is formed during the manufacturing process. This CTE mismatch between the epoxy-based transparent resin 102 and the substrate 108, which may be referred to as a base substrate, may cause warpage during manufacturing, and this warpage may lead to high yield losses as this warpage can damage sensitive components (e.g., the plurality of wirebonds 106 or electronic components within or on the plurality of dice 104) of the example of the semiconductor package 122. Furthermore, the epoxy-based transparent resin 102 tends to have high water absorption percentages (%) such that epoxy-based transparent resin 102 tends to suffer during moisture sensitivity level (MSL) tests. However, once manufactured this example of the semiconductor package 122 with the epoxy-based transparent resin 102 may be relatively robust, but the utilization of the epoxy-based transparent resin 102 generally comes at the cost of high yield loss during manufacturing as well as potentially causing later reliability issues that may be due to the thermomechanical issues (e.g., warpage) during manufacturing of the example of the semiconductor package 122 or during utilizing of the semiconductor package 122 within an electronic consumer device.

For example, utilizing a silicone-based transparent resin 102 to manufacture the example of the semiconductor package 122 at the panel level (e.g., package assembly panel 98) tends to cause difficulties and challenges in singulation of the example of the semiconductor package 122. The silicone-based transparent resin 102 tends to have a very low Young's modulus and a very high CTE, which allows the silicone-based transparent resin 102 to adapt and expand while preventing or minimizing the introduction of warpage related issues in manufacturing the example of the semiconductor package 122. However, a drawback of the silicone-based transparent resin 102 is that singulation of the semiconductor package 122 is highly challenging due to the softness and pliability of the silicone-based transparent resin 102 as a result of the low Young's modulus of the silicone-based transparent resin 102. This softness and pliability of the silicone-based transparent resin 102 generally leads to significant cosmetic issues within the example of the semiconductor package 122. For this reason a dedicated or customized mold structure or tool, for example, chocolate bar mold 100, is utilized to reduce a size of the second portions 116 of the silicone-based transparent resin 102 that needs to be singulated through to manufacture the example of the semiconductor package 122. Another challenge is that the silicone-based transparent resin 102 tends to be sticky and slightly adhesive in nature. This stickiness or slight adhesive quality of the silicone-based transparent resin 102 generally results in portions of the silicone-based transparent resin 102 being removed when the chocolate bar mold structure 100 is being pulled away, for example, in the direction of the arrow 118, when forming the silicone-based transparent resin 102 on the surface 107 of the substrate 108. Also, since this example of the semiconductor package 122 with the plurality of dice 104 may be mounted within consumer devices (e.g., phones, tablets, computers, etc.) that have thin profiles, utilizing the silicone-based transparent resin on a standard land grid array (LGA) substrate generally causes a reduction in overall rigidity of the example of the semiconductor package 122. This reduced rigidity may impact, for example, integrity or robustness of the plurality of wirebonds 106 during handling or during operational lifespan of the consumer devices by their owners or users.

For example, the significant cosmetic issues when utilizing the silicone-based transparent resin 102 may include silicone-based transparent resin residue being present on the plurality of sidewalls 126 of the substrate 108 of the example of the semiconductor package 122 as shown in FIG. 2B of the present disclosure. The silicone-based transparent resin residue may become smeared or present on the plurality of sidewalls 126 when singulating the package assembly panel 98 to form the example of the semiconductor package 122. For example, when a sawing singulation tool is utilized, the pliability, softness, and slight adhesive quality of the silicone-based transparent resin 102 may become caught or remain adhered to a saw blade of the sawing singulation tool. This silicone-based transparent resin 102 that becomes adhered to the saw blade may then be transferred to the plurality of sidewalls 126 of the substrate 108 as the saw blade initially singulates the silicone-based transparent resin 102 and the substrate 108. The transfer of the silicone-based transparent resin 102 to the plurality of sidewalls 126 results in the build up of the silicone-based transparent resin residue on the plurality of sidewalls 126. This silicone-based transparent resin residue on the plurality of sidewalls 126 will generally look ugly and the example of the semiconductor package 122 may appear defective or damaged to a manufacturer of consumer devices that may perform their own quality control check on the example of the semiconductor package 122 before positioning the example of the semiconductor package 122 within the consumer device. For example, while the example of the semiconductor package 122 may be completely functional and usable within the consumer device even with the presence of the silicone-based transparent resin residue on the plurality of sidewalls 126, the manufacturer of the consumer device may wrongly determine that the example of the semiconductor package 122 is defective due to this visible deformity.

In view of the above discussions with respect to the example of the semiconductor package 122 and the method of manufacturing the example of the semiconductor package 122, the present disclosure is directed to embodiments of semiconductor packages that overcome the challenges and difficulties as set forth above. The present disclosure is directed to embodiments of methods of manufacturing the embodiments of the semiconductor packages that overcome the challenges and difficulties as set forth above. For example, the embodiments of the semiconductor packages of the present disclosure may not require customized or dedicated mold structures or tools (e.g., chocolate bar mold 100) such that universal and non-customized mold structures or tools readily available may be utilized. Utilizing the non-customized or universal mold tools and structures instead of the customized or dedicated mold structures or tools (e.g., chocolate bar mold 100) reduces tool costs as fewer specialized tools are purchased and placed within a semiconductor manufacturing plant (FAB). For example, the non-customized or universal mold tools may be utilized to manufacture any number of various semiconductor packages including the embodiments of the semiconductor packages 200, 300, whereas utilizing the customized or dedicated mold structures or tools (e.g., chocolate bar mold 100) may limit the number of various types of shaped and sized semiconductor packages that may be manufactured. In other words, reducing or consolidating a number of customized or dedicated mold structure tools or structures being utilized within the FAB to manufacture variously sized and shaped semiconductor packages reduces costs to run the FAB as well as reduces maintenance costs to run the FAB. The embodiments of the semiconductor packages 200, 300 as well as the methods of manufacturing these embodiments of the present disclosure prevent and avoid the warpage issues and the cosmetic issues that may occur in the example of the semiconductor package 122 as discussed above.

Figure 3A:
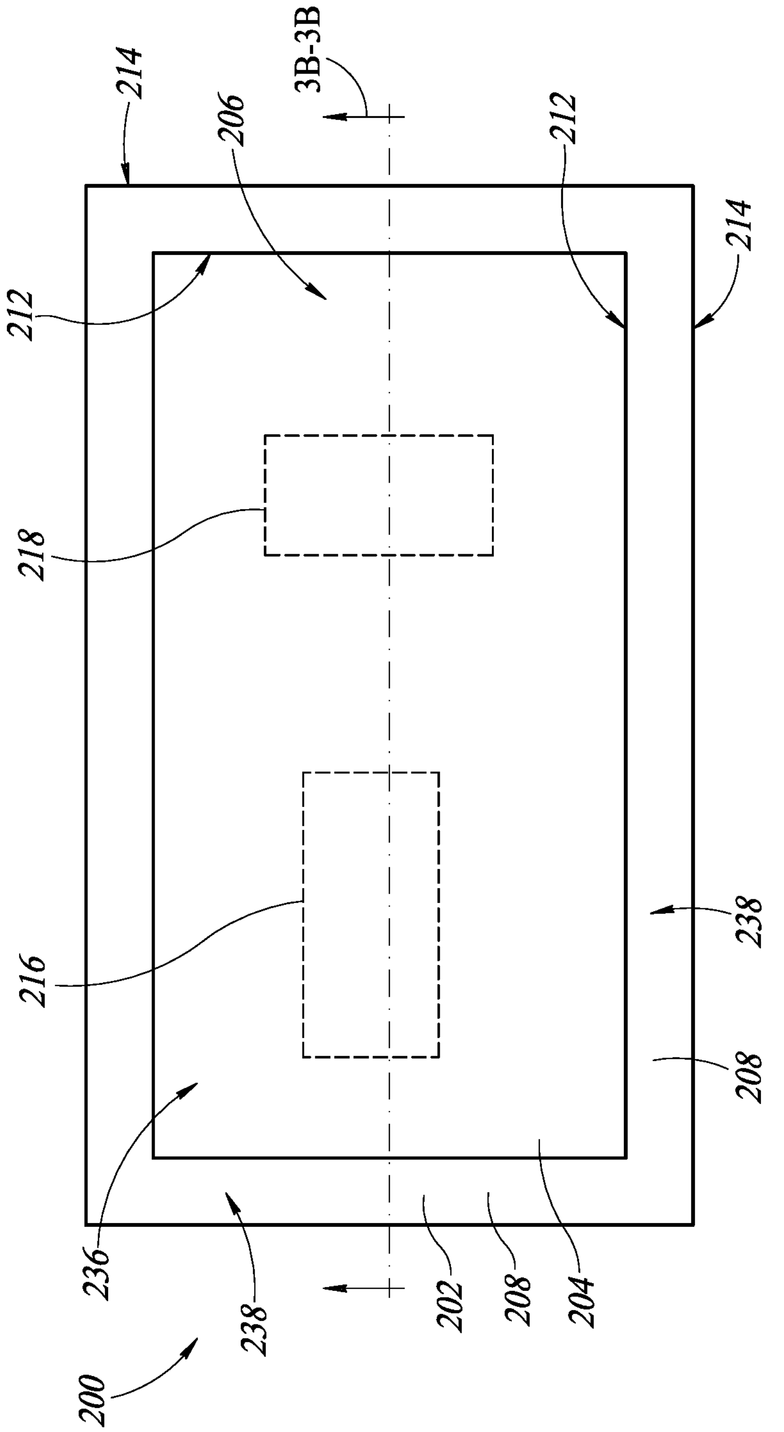
FIG. 3A is a top plan view of an embodiment of a semiconductor package of the present disclosure.
Figure 3B:
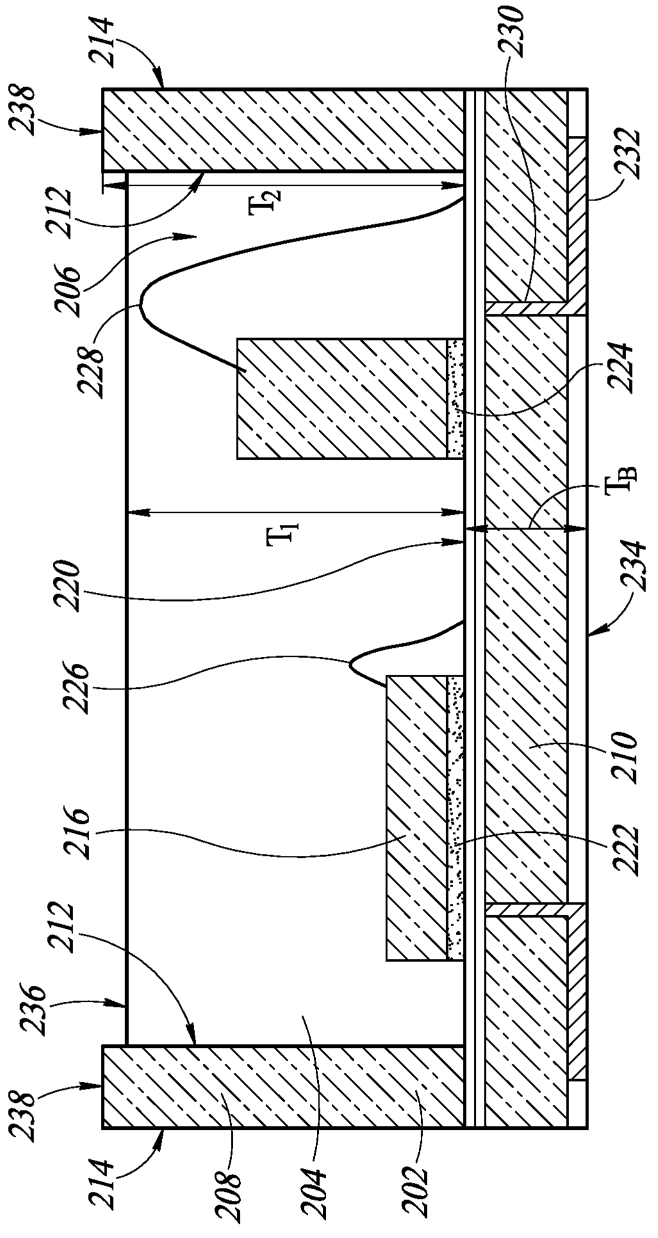
FIG. 3B is a cross-sectional view of the embodiment of the semiconductor package taken along line 3B-3B as shown in FIG. 3A.

FIG. 3A is a top plan view of an embodiment of a semiconductor package 200 of the present disclosure, and FIG. 3B is a cross-sectional view of the semiconductor package 200 taken along line 3B-3B as shown in FIG. 3A. The semiconductor package 200 includes a substrate 202, a transparent resin 204 within a cavity 206 present between a plurality of walls 208 of the substrate 202, and a base portion 210 of the substrate 202. Each one of the plurality of walls 208 includes an internal sidewall or surface 212 and an external sidewall 214 or surface opposite a corresponding internal sidewall or surface of the internal sidewalls or surfaces 212, respectively, of the plurality of walls 208. The transparent resin 204 is present on the internal sidewalls 212 of the plurality of walls 208. A first die 216 is within the transparent resin 204 and is encased between the transparent resin 204 and the base portion 210, and a second die 218 is within the transparent resin 204 and is encased between the transparent resin 204 and the base portion 210. The first die 216 is on a surface 220 of the base portion 210, and the first die 216 is coupled to the surface 220 of the base portion 210 by a first adhesive 222. The second die 218 is on the surface 220 of the base portion 210, and the second die 218 is coupled to the surface 220 of the base portion 210 by a second adhesive 224. The transparent resin 204 may be an epoxy-based transparent resin or may be a silicone-based transparent resin.

The cavity 206 as shown in FIGS. 3A and 3B is at least partially delimited by the surface 220 of the base portion 210 and the internal sidewalls 212 of the substrate 202. The plurality of walls 208 extend around the transparent resin 204 within the cavity 206, and the first and second dice 216, 218 are spaced inward from the internal sidewalls 212 of the plurality of walls 208, respectively.

At least one first wirebond 226 has a first end coupled to the first die 216 and a second end coupled to a conductive structure at the base portion 210 of the substrate 202. The conductive structure may be a respective electrical contact of the substrate 202 accessible at the surface 220 of the base portion 210. At least one second wirebond 228 has a third end coupled to the second die 218 and a fourth end coupled to a conductive structure at the base portion 210 of the substrate 202. The conductive structure may be a respective electrical contact of the substrate 202 accessible at the surface 220 of the base portion 210. The at least one first wirebond 226 provides a first electrical pathway such that electrical signals may readily travel to and from the first die 216, and the at least one second wirebond 228 provides a second electrical pathway such that electrical signals may readily travel to and from the second die 218. These respective conductive structures coupled to the second end of the first wirebond 226 and the fourth end of the second wirebond 228, respectively, are in electrical communication with at least one of a plurality of conductive vias 230 that extend through the base portion 210 to a plurality of contact pads 232 present at a surface 234 of the base portion 210 opposite to the surface 220 of the base portion 210. The semiconductor package 200 may be mounted within an electronic consumer device by utilizing a solder material that may be formed on the plurality of contact pads 232, respectively. For example, the solder material may be in the form of balls (e.g., solder balls) on the plurality of contact pads 232, respectively.

As shown in FIG. 3B, an exposed surface 236 of the transparent resin 204 remains exposed and bare such that radiation (e.g., UV light, ambient light, visible light, etc.) may travel into the transparent resin 204 through the exposed surface 236 and travel through the transparent resin 204 to the first and second dice 216, 218, respectively. In some embodiments, the first die 216 may detect a first type of light (e.g., UV light) and the second die 218 may detect a second type of light (e.g., visible light) different from the first type of light, the first die 216 may emit a radiation and the second die 218 may detect the radiation reflected off an object external to the semiconductor package (e.g., time-of-flight) 200, or the first and second dice 216, 218 may be any other suitable type of die that may be present within the transparent resin 204.

As shown in FIG. 3B, the transparent resin 204 has a first thickness T1 that extends from the surface 220 of the base portion 210 of the substrate 202 to the exposed surface 236 of the transparent resin 204. The plurality of walls 208 have a second thickness T2 that extends from the surface 220 to end surfaces 238 of the plurality of walls 208. Each one of the plurality of walls 208 includes a corresponding end surface 238 of the end surfaces of the plurality of walls 208. The end surfaces 238 are transverse to the internal and external sidewalls 212, 214 of the plurality of walls 208 of the substrate 202. The first thickness T1 being less than the second thickness T2 results in the exposed surface 236 being slightly recessed relative to the end surfaces 238 of the plurality of walls 208. In some alternative embodiments the first thickness T1 may be substantially equal to the second thickness T2 such that the exposed surface 236 of the transparent resin 204 is substantially coplanar and flush to the end surfaces 238 of the plurality of walls 208. In some embodiments, the first thickness T1 may be equal to or less than 500-microns. In some embodiments, the second thickness T2 may be slightly greater than the first thickness T1 (see FIG. 3B), or, in some alternative embodiments, the second thickness T2 may be equal to the first thickness T1 such that the end surfaces 238 are substantially coplanar and flush with the exposed surface 236. The base portion 210 of the substrate 202 may have a base portion thickness $T_B$ that extends from the surface 234 to the surface 220. In some embodiments, the base portion thickness $T_B$ may be equal to or less than 130-microns. When the transparent resin 204 is a silicone-based transparent resin, if a mold tool is utilized to form the silicone-based transparent resin within the cavity 206, contact between the surface 236 and a respective surface of the mold tool may be minimized or prevented. Minimizing or preventing contact between the respective surface of the mold tool and the silicone-based transparent resin reduces the likelihood that respective portions of the silicone-based transparent resin are pulled away when the mold tool is removed.

Figure 4A:
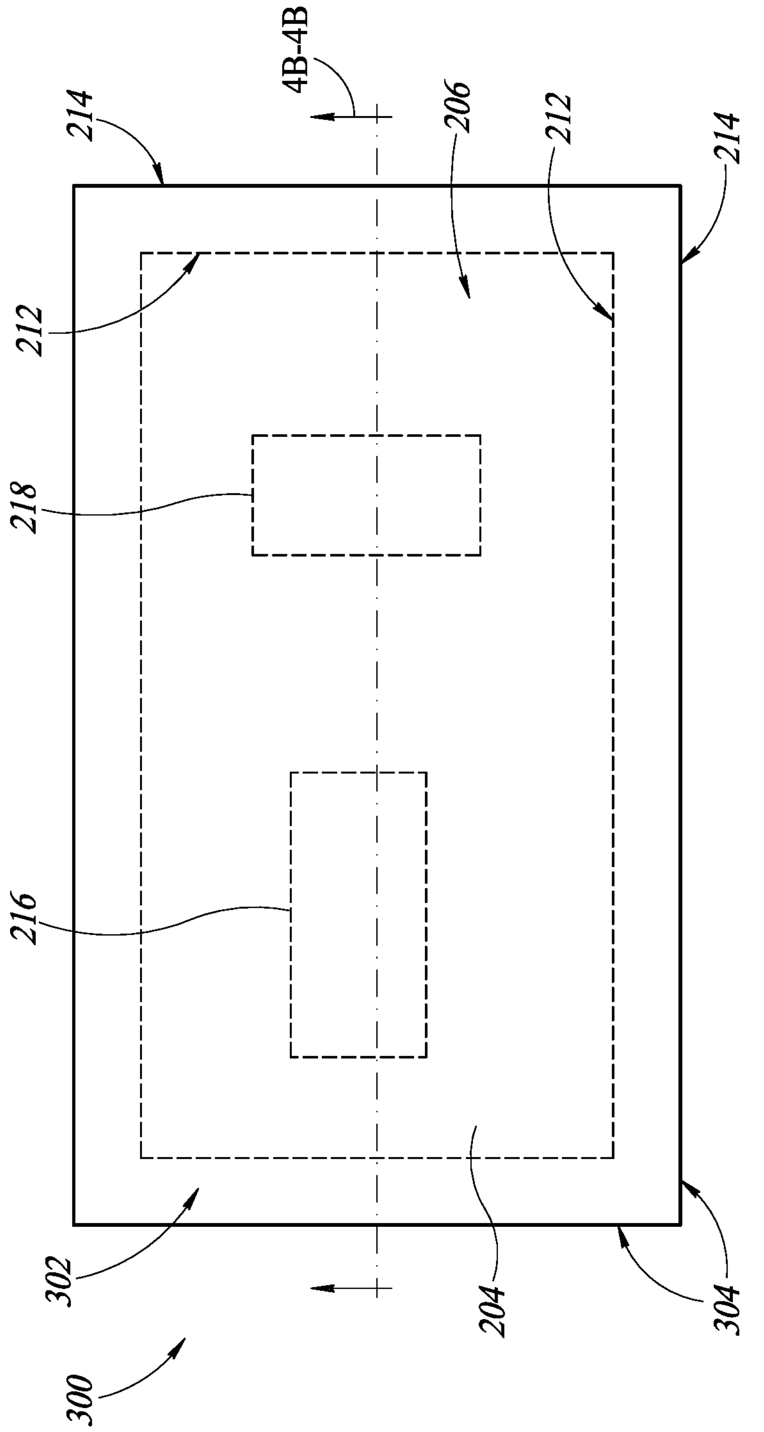
FIG. 4A is a top plan view of an embodiment of a semiconductor package of the present disclosure.
Figure 4B:
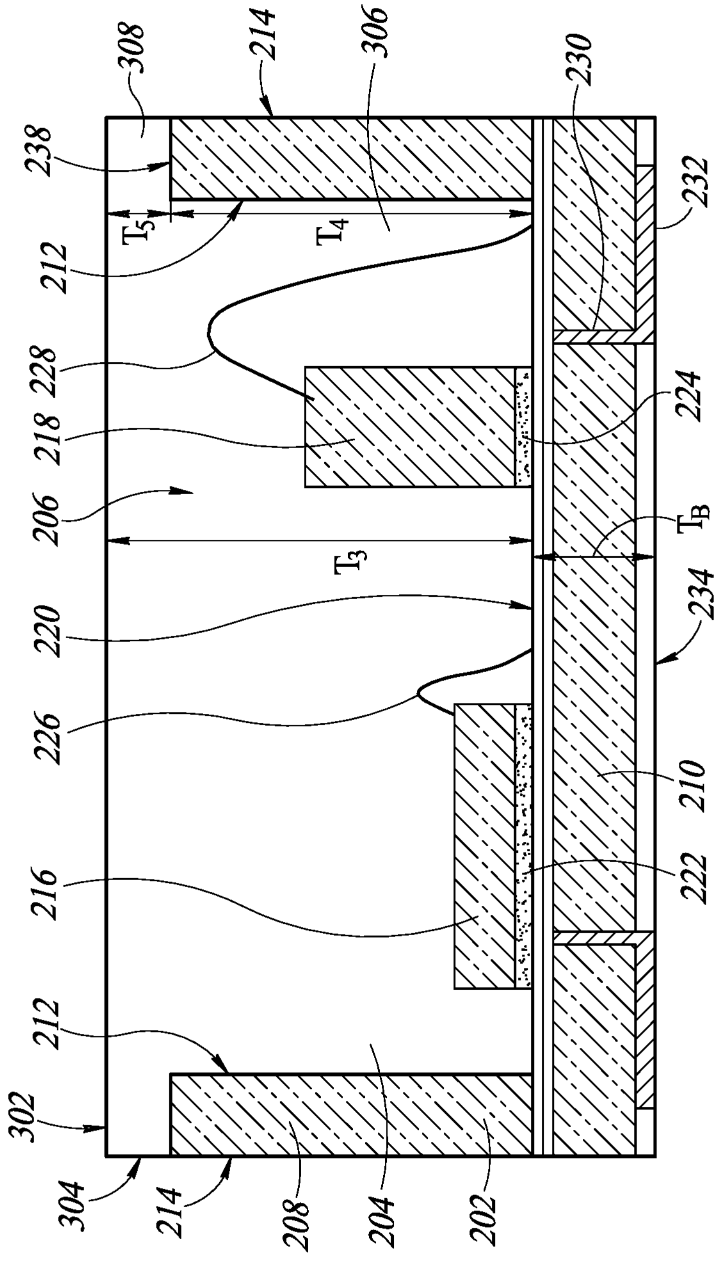
FIG. 4B is a cross-sectional view of the embodiment of the semiconductor package taken along line 4B-4B as shown in FIG. 4A.

FIG. 4A is a top plan view of an embodiment of a semiconductor package 300 of the present disclosure, and FIG. 4B is a cross-sectional view of the semiconductor package 300 taken along line 4B-4B as shown in FIG. 4A of the present disclosure. The semiconductor package 300 has several of the same or similar features as the semiconductor package 200 such that the same or similar features in the semiconductor package 300 as those in the semiconductor package 200 have the same or similar reference numerals of the semiconductor package 200. The focus of the following discussion will be on additional or different features of the semiconductor package 300 relative to the semiconductor package 200.

Unlike the semiconductor package 200 as shown in FIGS. 3A and 3B, the transparent resin 204 of the semiconductor package 300 overlaps the end surfaces 238 of the plurality of walls 208 such that the transparent resin 204 extends along and covers the end surfaces 238 of the plurality of walls 208. For example, an exposed surface 302 of the transparent resin 204 overlaps the end surfaces 238 of the plurality of walls 208. Each one of a plurality of sidewalls 304 of the transparent resin 204 extends from the exposed surface 302 to a corresponding end surface of the end surfaces 238 of the plurality of walls 208 of the substrate 202. Each one of the plurality of internal sidewalls 212 is transverse to the end surfaces 238 and to the exposed surface 302, respectively.

Unlike the semiconductor package as shown in FIGS. 3A and 3B, the transparent resin 204 of the semiconductor package 300 includes a first portion 306 and a second portion 308. The transparent resin 204 has a third thickness T3 that extends from the surface 220 of the base portion 210 of the substrate 202 to the exposed surface 302 of the transparent resin 204. The third thickness T3 may be an overall thickness of the semiconductor package 300. The third thickness T3 is an overall thickness of the transparent resin 204 in the semiconductor package 300, and the third thickness T3 is a sum of a fourth thickness T4 of the first portion 306 of the transparent resin 204 and a fifth thickness of the second portion 308 of the transparent resin 204. The fourth thickness T4 of the first portion 306 extends from the surface 220 of the base portion 210 to the end surfaces 238 of the plurality of walls 208, and the fifth thickness T5 extends from the end surfaces 238 of the plurality of walls 208 to the exposed surface 302 of the transparent resin 204. The fourth thickness T4 may be the thickness of each one of the plurality of walls 208 of the substrate 202. In some embodiments, the fourth thickness T4 may be less than or equal to 500-microns. In some embodiments, the fifth thickness T5 may be less than or equal to 100-microns.

As shown in FIG. 4B, the first die 216 and the second die 218 as well as the first wirebond 226 and the second wirebond 228 are encased within the first portion 306 of the transparent resin 204. In the embodiment of the semiconductor package 300 as shown in FIG. 4B, the first wirebond 226 and the second wirebond 228 do not extend into the second portion 308 of the transparent resin 204.

The transparent resin 204 in the respective semiconductor packages 200, 300 may be an epoxy-based transparent resin. The epoxy-based transparent resin may be utilized when it is desired to manufacture the respective semiconductor package 200, 300 to be robust against external stresses and strains (e.g., being dropped) through general use by a user of an electronic device in which the respective semiconductor packages 200, 300 is present. For example, as these electronic devices become thinner, the epoxy-based transparent resin may be utilized to increase the robustness of the respective semiconductor package 200, 300 that is to be present within the relatively thin electronic devices.

The transparent resin 204 in the respective semiconductor packages 200, 300 may be a silicone-based transparent resin. The silicone-based transparent resin may be utilized when there is a lesser demand on the respective semiconductor packages 200, 300 to be robust as compared to utilizing the epoxy-based transparent resin, and there is a greater demand to decrease yield loss. While the silicone-based transparent resin may have a coefficient of thermal expansion (CTE) greater than the CTE of the epoxy-based transparent resin, the silicone-based transparent resin has a Young's modulus that is lesser than that of the epoxy-based transparent resin. While the silicone-based transparent resin may expand a greater amount when exposed to thermal energy, the silicone-based transparent resin is more pliable, soft, and malleable such that as the silicone-based transparent resin expands along a path of lesser resistance and does not apply as much pressure on adjacent components relative to when the epoxy-based transparent resin expands.

The epoxy-based transparent resin is more water absorbent than the silicone-based transparent resin. In other words, the silicone-based transparent resin is more resistant to water than the epoxy-based transparent resin. For example, when performing a moisture sensitivity level (MSL) test on the respective semiconductor packages 200, 300 when having the epoxy-based transparent resin, water damage may occur within sensitive electronic components (e.g., respective wirebonds 226, 228, respective dice 216, 218, etc.) within the respective semiconductor packages 200, 300. Oppositely, when performing the moisture sensitivity level (MSL) test on the respective semiconductor packages 200, 300 when having the silicone-based transparent resin, water damage is less likely to occur as the silicone-based transparent resin is less water absorbent than the epoxy-based transparent resin, which is generally considered to be impermeable to moisture. In view of this water absorption discussion of the epoxy-based and the silicone-based transparent resin, the silicone-based transparent resin may be selected for the transparent resin 204 over the epoxy-based transparent resin if there is an increased likelihood that the respective semiconductor packages 200, 300 may become exposed to water when in use within an electronic device or if reduced yield loss is desired during manufacturing of the package 200, 300, respectively.

In view of the above discussion with respect to selecting either the transparent resin 204 to be the epoxy-based transparent resin or the silicone-based transparent resin, there will be other factors that are considered during the manufacturing processes of the semiconductor packages in selecting whether the transparent resin 204 is to be the epoxy-based transparent resin or the silicone-based transparent resin. For example, manufacturing the respective semiconductor packages 200, 300 utilizing the epoxy-based transparent resin may increase yield loss due to warpage but may result in fewer cosmetic issues, whereas manufacturing the respective semiconductor packages, 200, 300 utilizing the silicone-based transparent resin may decrease yield loss but may result in an increase in cosmetic issues.

As discussed above, the transparent resin 204 in the semiconductor package 200 does not extend onto the end surfaces 238 of the plurality of walls 208 such that the end surfaces 238 of the plurality of walls 208 are bare. Oppositely, the transparent resin 204 in the semiconductor package 300 does extend onto and cover the end surfaces 238 of the plurality of walls 208. The semiconductor package 200 may be slightly more costly and difficult to manufacture relative to manufacturing the semiconductor package 300.

In view of the above discussion, a manufacturer of the respective semiconductor packages 200, 300 may select either one of the epoxy-based transparent resin and the silicone-based transparent resin for the transparent resin 204 depending on an environment in which the respective semiconductor packages 200, 300 are to be utilized. In view of the above discussion, a manufacturer of the respective semiconductor packages 200, 300 may select either one of having the transparent resin 204 not present on the end surfaces 238 (see FIGS. 3A and 3B) or not present on the end surfaces 238 (see FIGS. 4A and 4B).

Figure 5:
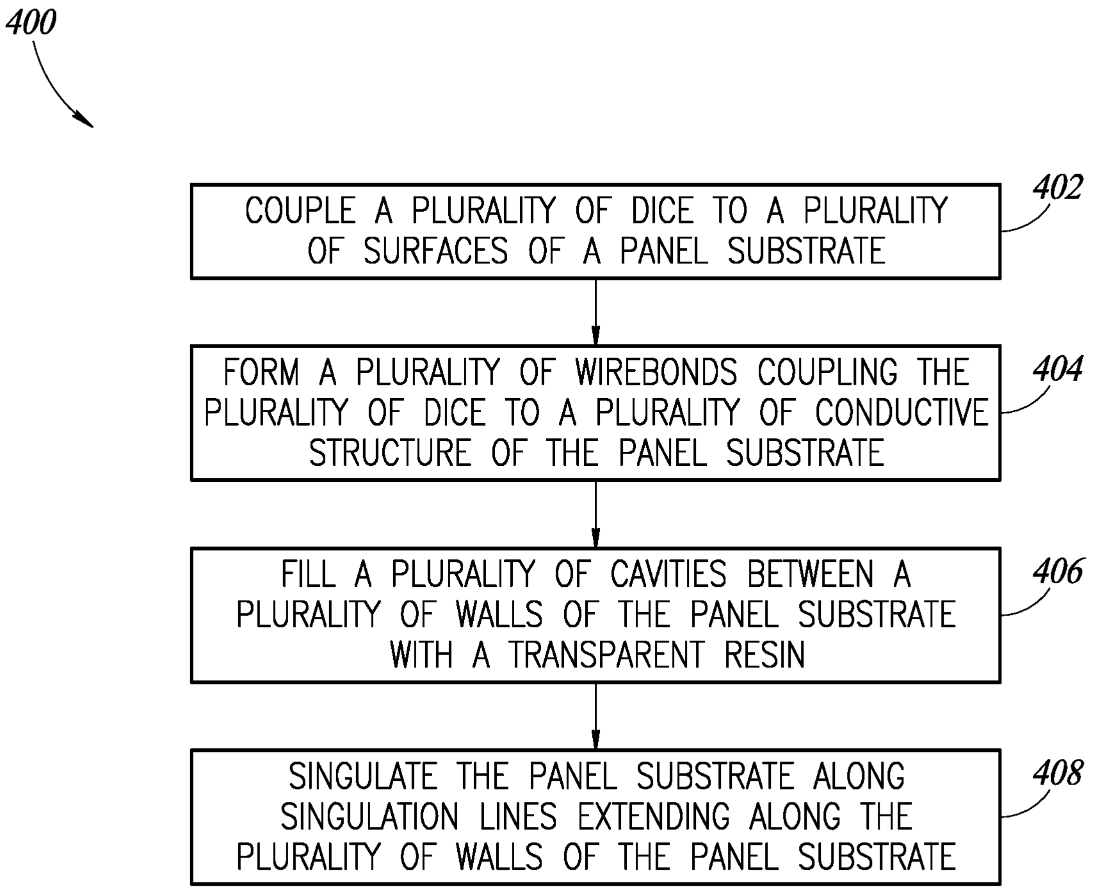
FIG. 5 is a flowchart of an embodiment of a method of manufacturing the embodiment of the semiconductor package of the present disclosure as shown in FIGS. 3A and 3B.

FIG. 5 is a flowchart 400 of a method of manufacturing the semiconductor package 200 as shown in FIGS. 3A and 3B of the present disclosure. The flowchart 400 includes a first step 402, a second step 404, a third step 406, and a fourth step 408. FIGS. 6A-6D are directed to cross-sectional views with respect to carrying out the method of manufacturing as shown in the flowchart 400 as shown in FIG. 5 of the present disclosure.

Figure 6A:
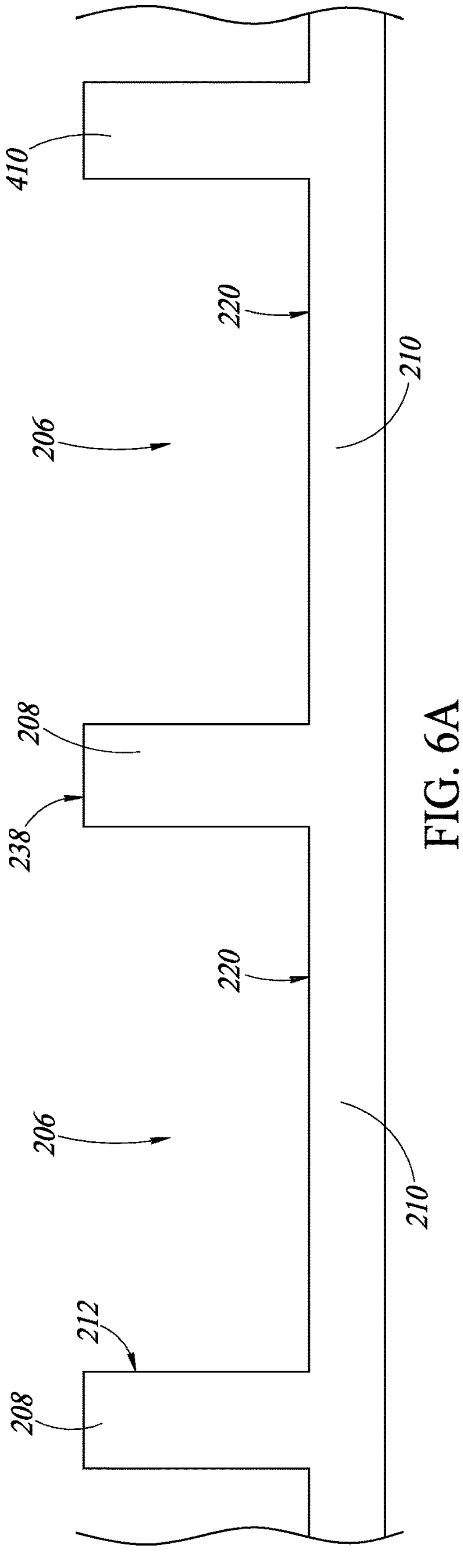
FIGS. 6A-6D are directed to cross-sectional views of steps in the embodiment of the method of manufacturing of the flowchart as shown in FIG. 5.

As shown in FIG. 6A, a panel substrate 410 is provided, and the panel substrate 410 includes a plurality of the cavities 206, a plurality of the walls 208, and a plurality of the base portions 210. It will be readily appreciated that details and features of the panel substrate 410 are not shown and omitted for simplicity and brevity in FIGS. 6A-6D, for example, the plurality of conductive vias 230 and the plurality of contact pads 232, respectively, are not shown in FIGS. 6A-6D, respectively. Each one of the plurality of cavities 206 are delimited by respective ones of the plurality of internal sidewalls 212, respectively.

Figure 6B:
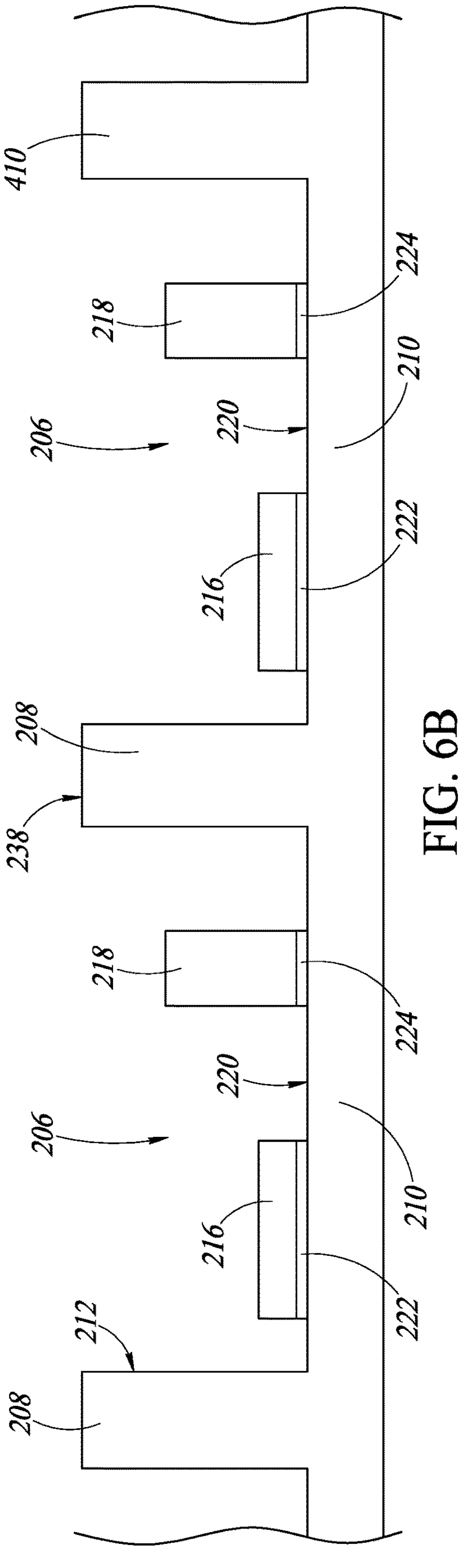
Figure 6C:
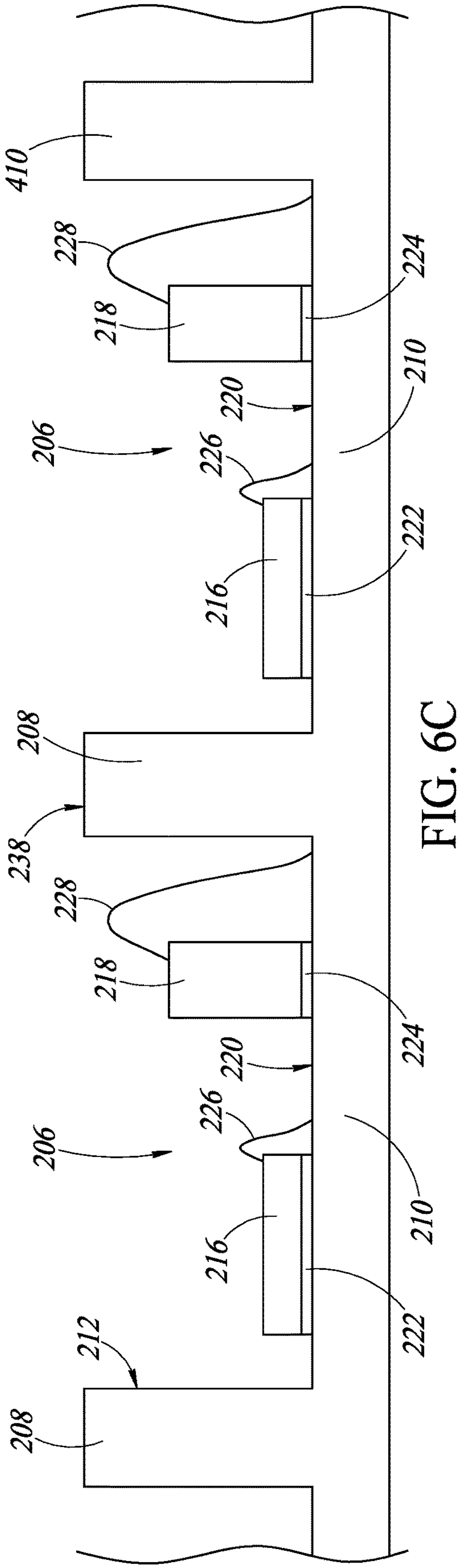

In the first step 402, a plurality of the first dice 216 and a plurality of the second dice 218 are positioned within the plurality of cavities 206 as shown in FIG. 6B. The first dice 216 are coupled to the surfaces 220 of the base portions 210 by a plurality of the first adhesive layers 222, and the second dice are coupled to the surfaces 220 of the base portions 210 by a plurality of the second adhesive layers 224. For example, in some embodiments, the first and second dice 216, 218 may be positioned on and coupled to the surfaces 220 of the base portions 210 by a pick-and-place machine or by some other suitable machine or technique to position or form the first and second dice 216, 218 within the cavities 206 of the panel substrate 410.

After the first step 402, in the second step 404 a plurality of the first wirebonds 226 and a plurality of the second wirebonds 228, respectively, are formed to form electrical pathways between the first and second dice 216, 218 and respective conductive structures (e.g., the conductive vias 230, the contact pads 232, etc.) of the panel substrate 410, respectively, as shown in FIG. 6B. For example, in some embodiments, the first and second wirebonds 226, 228 may be formed utilizing a ball-and-stitch technique or some other suitable technique for forming the first and second wirebonds 226, 228 within the cavities 206 of the panel substrate 410.

Figure 6D:
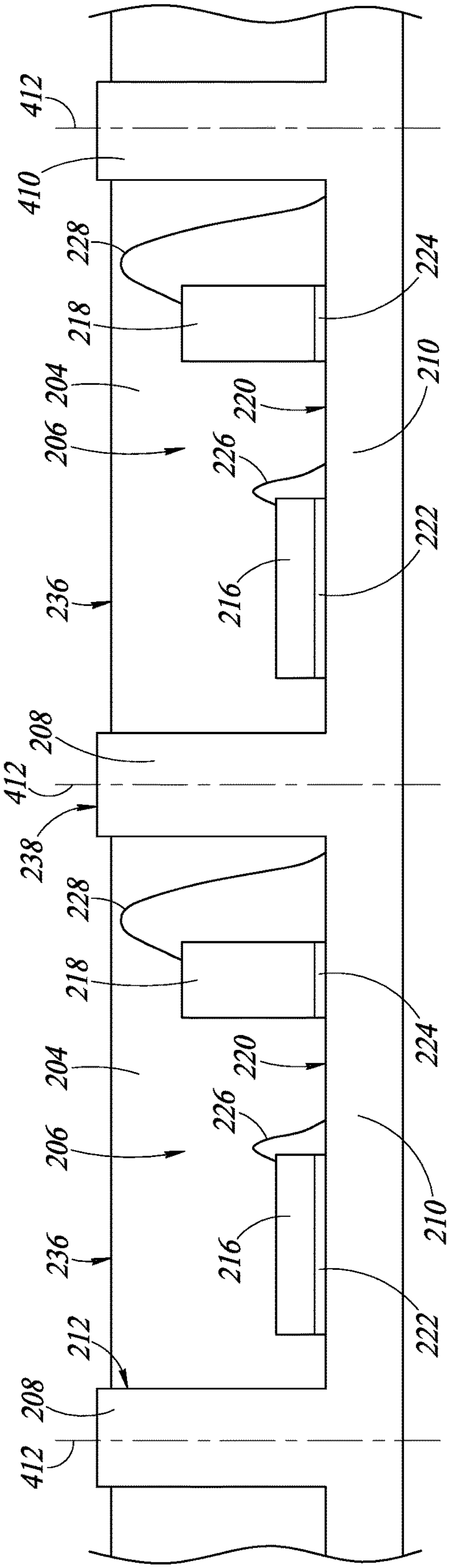

After the second step 404, in the third step 406 the transparent resin 204 is formed within the cavities 206 to encase the first and second dice 216, 218 and the first and second wirebonds 226, 228 within the transparent resin 204 as shown in FIG. 6D. In some embodiments, the transparent resin 204 is formed in each one of the cavities 206 of the panel substrate 410 by dispensing the transparent resin 204 into each one of cavities 206. For example, an injection tool with one or more injection tips may be utilized to inject the transparent resin 204 when in fluid or semi-fluid form through the one or more injection tips and directly into ones of the cavities 206 of the panel substrate 410. In some embodiments, the injection tool includes a plurality of injection tips such that the transparent resin 204 may be injected into more than one of the cavities 206 simultaneously. When the injection tool dispenses the transparent resin 204 into the cavities 206 of the panel substrate 410, an amount of the transparent resin 204 may be dispensed into the cavities such that a plurality of the exposed surfaces 236 are recessed relative to the end surfaces 238 of the plurality of walls 208 of the panel substrate 410. The exposed surfaces 236 being recessed relative to the end surfaces 238 may be more readily seen in the singulated and individualized semiconductor package 200 as shown in FIGS. 3A and 3B of the present disclosure. In some alternative embodiments of forming the semiconductor package 200, the transparent resin 204 may be dispensed into the cavities 206 such that the exposed surfaces 236 of the transparent resin 204 are substantially coplanar and flush with the end surfaces 238 of the plurality of walls 208 of the panel substrate 410.

Figure 8:
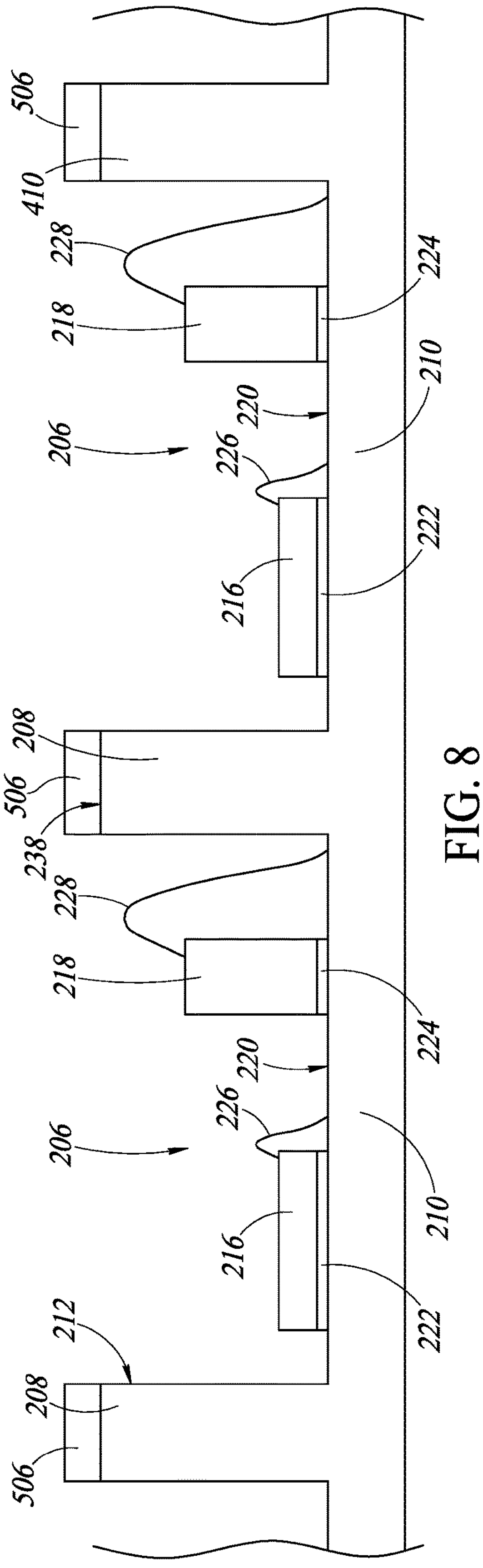
FIG. 8 is a cross-sectional view of a step of the flowchart of the alternative embodiment of the method of manufacturing of the flowchart as shown in FIG. 7.

Alternatively, instead of utilizing the injection tool as discussed above to form the transparent resin 204 in the cavities 206, the transparent resin 204 may be formed within the cavities 206 utilizing a transfer molding technique, a compression molding technique, or some other suitable type of technique to form the transparent resin 204 in the cavities 206. Further details of utilizing a transfer molding technique or a compression molding technique to form the transparent resin 204 within the cavities 206 may be seen in the below discussion with respect to at least FIG. 8 of the present disclosure.

After the third step 406, in a fourth step 408 the panel substrate 410 is singulated along singulation lines 412 as shown in FIG. 6D. Each one of the singulation lines 412 is aligned with at least one corresponding one of the plurality of walls 208 of the panel substrate 410. Singulating the panel substrate 410 along the plurality of walls 208 forms singulated and individualized ones of the semiconductor package 200 as shown in FIGS. 3A and 3B of the present disclosure. Singulating the panel substrate 410 along the plurality of walls 208 forms the plurality of external sidewalls 214 of the individualized and singulated ones of the semiconductor package 200 as shown in FIGS. 3A and 3B. The panel substrate 410 may be singulated utilizing a singulation tool such as a saw singulation tool, a laser singulation tool, or some other suitable type of singulation tool or technique that may be utilized to singulate the panel substrate 410 along the plurality of walls 208.

The method of manufacturing as discussed above with respect to the flowchart 400 to manufacture singulated and individualized ones of the semiconductor packages 200 prevents or avoids challenges that may occur when forming the example of the semiconductor package 122 as shown and discussed above with respect to FIGS. 1, 2A, and 2B of the present disclosure. For example, replacing the customized and dedicated mold tool or structure 100 (e.g., the chocolate bar mold 100) reduces costs, and utilizing the panel substrate 410 with the plurality of walls 208 reduces thermomechanical issues while manufacturing the individualized and singulated ones of the semiconductor package 200.

As discussed earlier herein, manufacturing the semiconductor package 122 includes utilizing a customized or dedicated mold structure 100 (e.g., the cholate bar mold), whereas manufacturing the semiconductor package 200 does not include utilizing the customized or dedicated mold structure (e.g., the chocolate bar mold 100). For example, the embodiments of the semiconductor package 200 of the present disclosure may not require customized or dedicated mold structures or tools (e.g., chocolate bar mold 100. When the injection tool is utilized to form the transparent resin 204, there may be no mold structures or tools utilized to form the individualized and singulated ones of the semiconductor package 200. Alternatively, when a transfer mold process or a compression mold process is utilized to manufacture the individualized and singulated ones of the semiconductor package 200, universal and non-customized mold structures or tools readily available may be utilized instead of the customized or dedicated mold structure 100 (e.g., the chocolate bar mold). Utilizing the non-customized or universal mold tools and structures when forming the semiconductor package 200 with a transfer mold process or a compression mold process instead of the customized or dedicated mold structures or tools (e.g., chocolate bar mold 100) reduces tool costs as fewer specialized and customized tools or molds are purchased and placed within a semiconductor manufacturing plant (FAB). For example, the non-customized or universal mold tools or structures may be utilized to manufacture any number of various semiconductor packages including the embodiments of the semiconductor package 200, whereas utilizing the customized or dedicated mold structures or tools (e.g., chocolate bar mold 100) may limit the number of various types of shaped and sized semiconductor packages that may be manufactured. In other words, reducing or consolidating a number of customized or dedicated mold tools or structures (e.g., the chocolate bar mold 100) by replacing them with non-customized and universal mold tools or structures increases a number of various types of sized and shaped semiconductor packages within the FAB that may be manufactured as well as reduces tool-purchasing costs.

As discussed earlier herein, manufacturing the semiconductor package 122 may result in warpage issues between the substrate 108 and the transparent resin 102 due to the CTE mismatch between the substrate 108 and the transparent resin 102. For example, the substrate 108 may have a CTE substantially equal to 15-20 ppm/° C., whereas the transparent resin 102 may have a CTE substantially equal to 50-60 ppm/° C. when the transparent resin is epoxy-based or the transparent resin 102 may have a CTE substantially equal to 200-300 ppm/° C. when the transparent resin is silicone-based. As the CTE of the transparent resin 102, regardless of whether the transparent resin 102 is epoxy-based or silicone-based, is greater than the CTE of the substrate 108, the transparent resin 102 generally expands or contracts by a greater amount as compared to an amount that the substrate 108 expands or contracts when the package assembly panel 98 is exposed to the thermal energy (e.g., an increase or a decrease in temperature). For example, when curing the transparent resin 102, singulating the package assembly panel 98, or during other steps in manufacturing the example of the semiconductor package 122 in which the package assembly panel 98 is exposed to thermal energy, the transparent resin 102 expands a different amount than the substrate 108, which may cause the propagation of thermomechanical issues in the individualized and singulated ones of the example of the semiconductor package 122. For example, these thermomechanical issues may include partial or complete delamination of the transparent resin 102 from surface 107 of the substrate 108, cracks within the transparent resin 102, or other types of thermomechanical issues that may be present within the example of the semiconductor package 122. These thermomechanical issues within the semiconductor package 122 generally result in a high yield loss.

While manufacturing the semiconductor package 122 has the high yield loss, manufacturing the individualized and singulated ones of the embodiments of the semiconductor package 200 has a reduced yield loss as compared to manufacturing the semiconductor package 122. For example, the plurality of walls 208 of the panel substrate 410 delimit expansion and contraction of the transparent resin 204 when performing the method of manufacturing the individualized and singulated ones of the plurality of semiconductor package 200. The plurality of walls 208 direct the expansion to be directed away from the base portion 210 of the substrate, which reduces the likelihood of the transparent resin 204 from partially or completely delaminating from the surface 220 of the base portion 210 of the substrate 202 and reduces the likelihood of cracking within the transparent resin.

As discussed earlier herein, when the transparent resin 102 of the example of the semiconductor package 122 is a silicone-based transparent resin and the package panel assembly 98 is singulated into individualized and singulated ones of the example of the semiconductor package 122, residue of the silicone-based transparent resin may remain present on the plurality of sidewalls 126 resulting in cosmetic issues along the plurality of sidewalls 126 in the complete example of the semiconductor package 122. This silicone-based transparent resin residue on the plurality of sidewalls 126 will generally look ugly and the example of the semiconductor package 122 may appear defective or damaged to a manufacturer of consumer devices that may perform their own quality control on the example of the semiconductor package 122 before positioning the example of the semiconductor package 122 within the consumer device.

While manufacturing the semiconductor package 122 has cosmetic issues that occur when singulating the package panel assembly 98, manufacturing the individualized and singulated ones of the embodiments of the semiconductor package 200 has a reduced likelihood of cosmetic issues occurring as compared to manufacturing the example of the semiconductor package 122. For example, the plurality of walls 208 of the panel substrate 108 are singulated along such that, when the transparent resin 204 is silicone-based, the transparent resin 204 is not singulated through, preventing and avoiding cosmetic issues on the external sidewalls 214.

Figure 7:
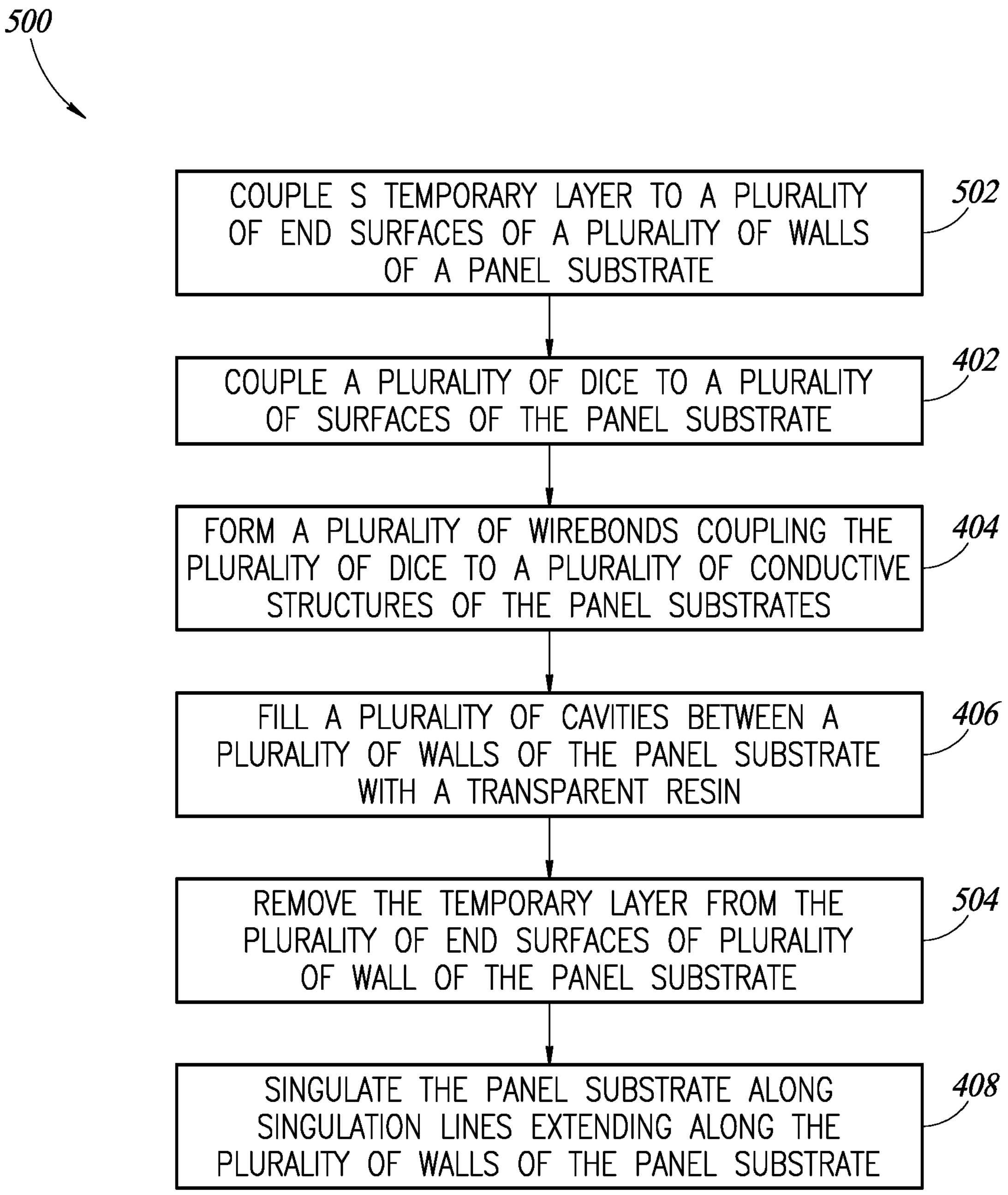
FIG. 7 is a flowchart of an alternative embodiment of a method of manufacturing of the semiconductor package as shown in FIGS. 3A and 3B.

FIG. 7 is a flowchart 500 of an alternative embodiment of a method of manufacturing individualized and singulated ones of the plurality of semiconductor packages 200 as shown in FIGS. 3A and 3B of the present disclosure. This alternative method of manufacturing in the flowchart 500 to manufacture the semiconductor packages 200 has several of the same or similar features and steps as the method of manufacturing in the flowchart 400. The same or similar features or steps in the flowchart 500 relative to the flowchart 400 have the same or similar reference numerals as in the flowchart 400. The focus of the following discussion will be on additional or different features or steps in the method of manufacturing of the flowchart 500 relative to the method of manufacturing of the flowchart 400.

Unlike the method of manufacturing in the flowchart 400, the method of manufacturing in the flowchart 500 includes a step 502 that occurs before the first, second, third, and fourth steps 402, 404, 406, 408, respectively, and includes a step 504 that occurs between the third and fourth steps 406, 408, respectively. The same or similar processes are carried out in the first, second, third, and fourth steps 402, 404, 406, 408 as discussed above with respect to FIGS. 5 and 6A-6D of the present disclosure.

Before the first step 402 is carried out, step 502 is carried out to couple or form a temporary layer 506 to the end surfaces 238 of the plurality of walls 208 as shown in FIG. 7. In some embodiments, the temporary layer 506 is a tape 506 that is coupled to the end surfaces 238 to avoid adhesion of overflow of the transparent resin 204 to the end surfaces 238 of plurality of walls 208 of the panel substrate 410. For purposes of the following discussion of the flowchart 500, the temporary layer 506 will be the tape 506. A tape lamination machine, device, or tool may be utilized to apply and couple the tape 506 to the end surfaces 238 of the plurality of walls 208. For example, the end surfaces 238 are covered by the tape 506 and the tape 506 is coupled to the end surfaces 238 by an adhesive present between the end surfaces 238 and the tape 506. The tape 506 being coupled to the end surfaces 238 of the plurality of walls 208 of the panel substrate 410 may readily be seen in FIG. 8 of the present disclosure. The tape 506 generally will be coupled to the end surfaces 238 when a transfer molding process or a compression molding process is utilized to form the transparent resin 204 within the cavities 206 of the panel substrate 410 to prevent any overflow of the transparent resin 204 covering or being coupled to the end surfaces 238 of the plurality of walls 208 of the panel substrate when manufacturing individualized and singulated ones of the semiconductor packages 200. In other words, the tape 506 is configured to act as a barrier to prevent adhesion of overflow of the transparent resin 204 from the cavities 206 of the panel substrate 410 when forming the transparent resin 204 within the cavities 206 of the panel substrate 410. The tape 506 may be applied to the end surfaces 238 of the plurality of walls 208 of the panel substrate 410 even when utilizing the injection tool to inject the transparent resin 204 directly into the cavities 206 of the panel substrate 410 through one or more injection tips as well to avoid overflow of the transparent resin 204 from adhering to the end surfaces 238 of the plurality of walls 208 of the panel substrate 410.

The tape 506 is generally coupled to the end surfaces 238 of the end surfaces 238 of the plurality of walls 208 of the panel substrate 410 when utilizing a transfer molding process or a compression molding process as the transparent resin 204 will likely flow across the panel substrate and over the tape 506 to at least partially fill the cavities 206 of the panel substrate 410. For example, when utilizing a transfer molding process, one or more flow channels may be present between the tape 506 and a surface of a mold tool through which the transparent resin 204 may flow through to at least partially fill the cavities 206 of the panel substrate 410. Alternatively, for example, when utilizing a compression molding process, the transparent resin 204 may be compressed into the cavities 206 of the panel substrate 410, and, during this compression, the transparent resin 204 may flow past and over the tape 506 on the end surfaces 238 of the plurality of walls 208 of the panel substrate 410. If either of a transfer molding process or a compression molding process is utilized to form individualized and singulated ones of the semiconductor package 200, the tape 506 present on the end surfaces 238 of the plurality of walls 208 of the panel substrate 410 prevents adhesion of the transparent resin 204 to the end surfaces 238.

After step 502, the first, second, and third steps 402, 404, 406 are carried out in the same or similar fashion as discussed above with respect to FIGS. 5 and 6A-6D. After the third step 406, step 504 is carried out in which the tape 506 is removed from the end surfaces 238 of the plurality of walls 208 of the panel substrate 410. The tape 506 may be removed from the end surfaces 238 of the plurality of walls 208 of the panel substrate 410 by a tape removal tool, machine, or device. If there is any of the transparent resin 204 leftover on the tape 506 at the time the tape 506 is removed, the leftover of the transparent resin 204 (e.g., overflow of the transparent resin 204 onto the tape 506) is removed along with the tape 506 such that none of the leftover transparent resin 204 is adhered, coupled, or on the end surfaces 238 of the plurality of walls 208 of the panel substrate 410. After the tape 506 is removed from the end surfaces 238 of the plurality of walls 208 of the panel substrate 410 in step 504, the fourth step 408 is carried out in which the panel substrate 410 is singulated in the same or similar fashion as discussed above with respect to FIG. 6D to manufacture singulated and individualized ones of the semiconductor package 200.

In some alternative embodiments, the temporary layer 506 may instead be a layer of material that may be deposited onto the end surfaces 238 that may be deteriorated or removed from the end surfaces by exposing the temporary layer 506 to a chemical either in liquid or gaseous form.

In view of the above discussion with respect to the embodiments of the methods of manufacturing in the flowcharts 400, 500, it will be readily appreciated that the respective steps in flowcharts 400, 500 may be reorganized to form various embodiments of semiconductor packages. These various embodiments of the semiconductor packages may have the same or similar to features as those the embodiments of the semiconductor packages 200, 300 as shown in FIGS. 3A, 3B, 4A and 4B of the present disclosure.

The method of manufacturing as discussed above with respect to the flowchart 500 to manufacture singulated and individualized ones of the semiconductor package 200 prevents or avoids challenges that may occur when forming the example of the semiconductor package 122 as shown and discussed above with respect to FIGS. 1, 2A, and 2B of the present disclosure. For example, these issues or challenges (e.g., thermomechanical issues or cosmetic issues) that occur during manufacture of the example of the semiconductor package 122 that are prevented or avoided utilizing the method of manufacturing in the flowchart 400 are also prevented or avoided in utilizing the method of manufacturing in the flowchart 500 to manufacture individualized and singulated ones of the semiconductor package 200. In other words, while the method of manufacturing in the flowchart 500 is slightly different from the method of manufacturing in the flowchart 400, the method of manufacturing in the flowchart 500 prevents and avoids the same issues and challenges as set forth with manufacturing the example of the semiconductor package 122 as discussed earlier herein with respect to the method of manufacturing in the flowchart 400. For simplicity and brevity sake, as the prevention and avoiding the thermomechanical and cosmetic issues were discussed earlier herein with respect to the flowchart 400, the discussion of the prevention and avoiding the thermomechanical and cosmetic issues with respect to the flowchart 500 is not reproduced. This is because the method of manufacturing of the flowchart 500 avoids and prevents the same thermomechanical issues and cosmetic issues that are avoided and prevented by the method of manufacturing in the flowchart 400.

Figure 9:
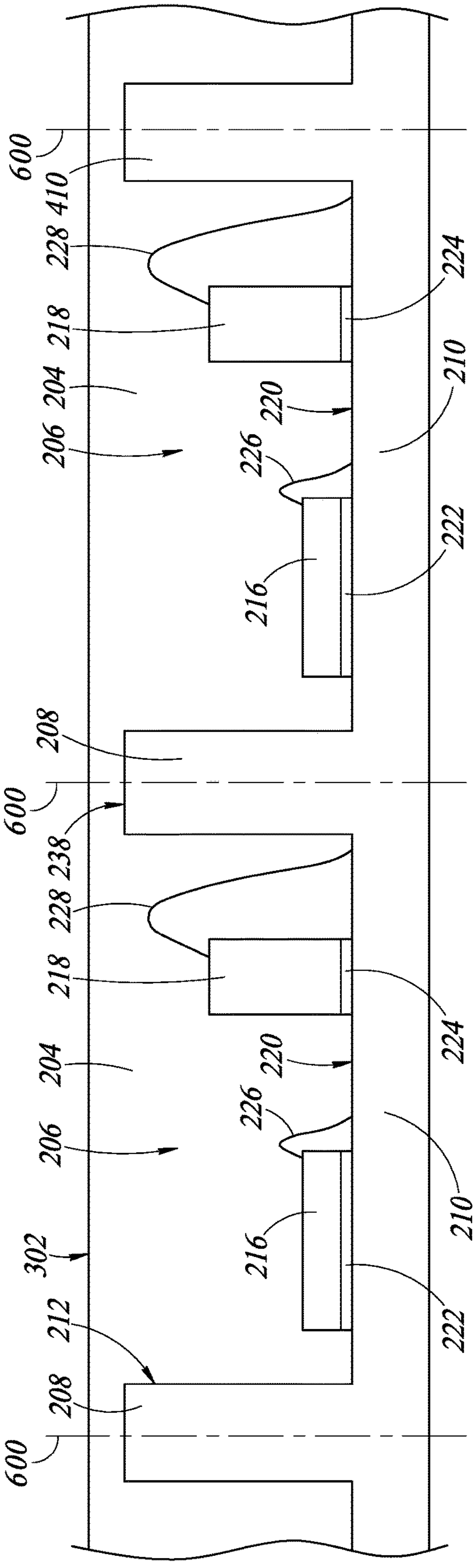
FIG. 9 is a cross-sectional view of a step of a method of manufacturing the semiconductor package as shown in FIGS. 4A and 4B.

FIG. 9 is a cross-sectional view of a step of an embodiment of a method of manufacturing the embodiment of the semiconductor package 300 as shown in FIGS. 4A and 4B of the present disclosure. Unlike in the method of manufacturing the semiconductor package 200 as shown in FIGS. 6A-6D, the transparent resin 204 is formed on the end surfaces 238 of the plurality of walls 208 of the panel substrate 410. For example, when the dispensing technique utilizing the injection tool with the one or more injection tips is utilized to form the transparent resin 204 in the cavities 206 in the fashion as discussed above with respect to the flowchart 400, an amount of the transparent resin 204 may be formed in the cavities 206 such that the transparent resin 204 overflows from the cavities 206 forming the transparent resin 204 on the end surfaces 238 of the plurality of walls 208 of the panel substrate 410.

Alternatively, for example, the transparent resin 204 may be formed on the end surfaces 238 of the plurality of walls 208 of the panel substrate 410 by not coupling the temporary layer 506 to the end surfaces 238 as discussed above with respect to the flowchart 500, and, instead, carrying out a transfer mold process or a compression mold process as discussed above with respect to the flowchart 500. When the tape 506 is not present on the end surfaces 238 of the plurality of walls 208 of the panel substrate 410 and the transparent resin 204 is overflowed onto the end surfaces 238 utilizing the injection tool, a transfer mold process, or a compression mold process, the transparent resin 204 adheres to the end surfaces 238 of the plurality of walls 208 of the panel substrate 410. After the transparent resin 204 is formed in the cavities 206 of the panel substrate and on the end surfaces 238 of the plurality of walls 208 of the panel substrate 410, the panel substrate 410 and the transparent resin 204 are singulated along singulation lines 600 as shown in FIG. 9 to form individualized and singulated ones of the semiconductor package 300 as shown in FIGS. 4A and 4B of the present disclosure.

The method of manufacturing as discussed above with respect to manufacturing singulated and individualized ones of the semiconductor package 300 prevents or avoids challenges that may occur when forming the example of the semiconductor package 122 as shown and discussed above with respect to FIGS. 1, 2A, and 2B of the present disclosure. The method of manufacturing as discussed above with respect to FIG. 9 to manufacture singulated and individualized ones of the semiconductor package 300 prevents or avoids challenges that may occur when forming the example of the semiconductor package 122 as shown and discussed above with respect to FIGS. 1, 2A, and 2B of the present disclosure. For example, these issues or challenges (e.g., thermomechanical issues or cosmetic issues) that occur during manufacture of the example of the semiconductor package 122 that are prevented or avoided utilizing the method of manufacturing in the flowchart 400 are also prevented or avoided in utilizing the method of manufacturing to manufacture individualized and singulated ones of the semiconductor package 300. In other words, while the method of manufacturing of the semiconductor package 300 is slightly different from the method of manufacturing in the flowchart 400, the method of manufacturing the semiconductor package 300 prevents and avoids the same issues and challenges as set forth with manufacturing the example of the semiconductor package 122 as discussed earlier herein with respect to the method of manufacturing in the flowchart 400. For simplicity and brevity sake, as the prevention and avoiding the thermomechanical and cosmetic issues were discussed earlier herein with respect to the flowchart 400, the discussion of the prevention and avoiding the thermomechanical and cosmetic issues with respect to the discussion of FIG. 9 is not reproduced. This is because the method of manufacturing as discussed with respect to FIG. 9 in manufacturing the semiconductor package 300 avoids and prevents the same thermomechanical issues and cosmetic issues that are avoided and prevented by the method of manufacturing in the flowchart 400.

However, unlike manufacturing the semiconductor package 200, the transparent resin 204 is formed on the end surfaces 238 of the plurality of walls 208 of the panel substrate 410, and respective portions of the transparent resin 204 present on the end surfaces 238 are singulated through. Unlike the transparent resin 102, which has the resin thickness $T_R$, that is partially singulated through resulting in the formation of the inclined sidewalls 124 that causes the cosmetic issues of residue of the transparent resin 102 when silicone-based building up on the sidewalls 126 of the substrate 108, the second portion 308 of the transparent resin 204 is present on the end surfaces 238 and the fifth thickness T5, which is less than the resin thickness $T_R$. As the fifth thickness T5 is significantly less than the resin thickness $T_R$, when respective portions of the second portion 308 of the transparent resin 204 when silicone-based are singulated through forming the sidewalls 304, little to no residue of the transparent resin 204 when silicone-based builds up on the external surfaces 214 of the plurality of walls 208 of the substrate 202. There is little to no build up of residue of the transparent resin 204 when silicone based on the external surfaces after this singulation through the second portions 308 and the plurality of walls 208 as the fifth thickness T5 is significantly less than the resin thickness $T_R$. Even if there is some build up of the transparent resin 204 when silicone-based on the external sidewalls 214, the build up is significantly less than the build up of the residue of the transparent resin 102 on the sidewalls 126 of the substrate 108. In other words, the fifth thickness T5 being less than the resin thickness $T_R$ reduces or prevents the residue of the transparent resin 204 when silicone-based on the external surfaces 214 of the plurality of walls 208 reducing or preventing the cosmetic issues similar to those in manufacturing the example of the semiconductor package 122.

As discussed herein, the embodiments of the semiconductor packages 200, 300 and the methods of manufacturing (e.g., respective flowcharts 400, 500) the semiconductor packages 200, 300 prevent or avoid the challenges with respect to the example of the semiconductor package 122 and the example of the method of manufacturing the semiconductor package 122.

A device of the present disclosure may be summarized as including: a substrate including: a base portion with a first surface and a second surface opposite to the first surface; a plurality of walls protruding from the first surface of the base portion, each one of the plurality of walls including an end surface that faces away from the base portion; and a cavity between the plurality of walls; a first die within the cavity and on the first surface of the base portion; and a silicone-based transparent resin within the cavity, the silicone-based transparent resin encasing the first die.

The end surfaces of the plurality of walls may be bare.

The silicone-based transparent resin may include a surface that is transverse to the plurality of walls, and the surface of the silicone-based transparent resin may extend between opposite ones of the plurality of walls.

The silicone-based transparent resin may further include: a first thickness that extends from the first surface of the base portion to the surface of the silicone-based transparent resin; and the plurality of walls may have a second thickness that extends from the end surfaces of the first surface of the base portion to the plurality of end surfaces of the walls, the second thickness being greater than the first thickness.

The surface of the silicone-based transparent resin may be in closer proximity to the first surface of the base substrate relative to the plurality of end surfaces of the plurality of walls.

The device may further include: a first wirebond having a first end coupled to the first die and a second end opposite the first end coupled to the base portion of the substrate.

The silicone-based transparent resin may cover the end surfaces of the plurality of walls.

The silicone-based transparent resin may further include: a first portion in the cavity having a first thickness; and a second portion on the first portion and on the end surfaces of the plurality of walls, the second portion having a second thickness less than the first thickness.

The second thickness may be less than or equal to 500-microns; and the first thickness may be less than or equal to 100-microns.

The plurality of walls may include a plurality of external sidewalls and a plurality of internal sidewalls, the plurality of internal sidewalls delimiting the cavity, and the plurality of internal sidewalls are opposite to the plurality of external sidewalls; and the second portion of the transparent resin may include a plurality of sidewalls, each one of the plurality of sidewalls of the second portion being coplanar or flush with a corresponding external surface of the plurality of external surfaces of the plurality of walls.

The device may further include: a second die in the cavity and on the first surface of the base portion; and a second wirebond having a third end coupled to the second die and a fourth end opposite the third end coupled to the base portion of the substrate.

The silicone-based transparent resin may encase the second die and the second wirebond.

A method of the present disclosure may be summarized as further including: coupling a die to a surface of a base portion of a panel substrate having a plurality of walls protruding from the base portion, the plurality of walls delimiting a cavity; encasing the die in a transparent resin by forming the transparent resin in the cavity; and singulating the panel substrate into a semiconductor package by singulating through the plurality of walls of the panel substrate.

The method further may further include: forming a wirebond coupling the die to a conductive structure accessible at the surface of the base portion of the panel substrate, and wherein forming the transparent resin in the cavity may include encasing the wirebond in the transparent resin.

The transparent resin may be at least one of the following of an epoxy-based transparent resin and a silicone-based transparent resin.

The method may further include: before forming the transparent resin, covering a plurality of end surfaces of the plurality of walls by coupling a temporary layer to the plurality of end surfaces to the plurality of walls; and after forming the transparent resin, removing the temporary layer from the plurality of end surfaces of the plurality of walls exposing the plurality of end surfaces, which remain bare.

The temporary layer may be a tape.

The forming the transparent resin in the plurality of cavities may include dispensing the transparent resin into each one of the plurality of cavities.

A method of the present disclosure may be summarized as further including: coupling a plurality of dice to a plurality of surfaces of a plurality of base portions of a panel substrate, between a plurality of walls of the panel substrate protruding from the plurality of base portions of the panel substrate, and in a plurality of cavities present between the plurality of walls; forming a plurality of wirebonds coupling the plurality of dice to a plurality of conductive structures accessible at the plurality of surfaces of the plurality of base portions of the panel substrate; forming a transparent resin including: encasing the plurality of dice and the plurality of wirebonds in the transparent resin; and covering a plurality of end surfaces of the plurality of walls with the transparent resin; and singulating the panel substrate and portions of the transparent resin on the plurality of end surfaces of the plurality of walls into a plurality of semiconductor packages along a plurality of singulation lines extending along the plurality of walls of the panel substrate and the portions of the transparent resin on the plurality of end surfaces of the plurality of walls.

The transparent resin may be at least one of the following of an epoxy-based transparent resin and a silicone-based transparent resin.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:

a substrate including:

a base portion with a first surface and a second surface opposite to the first surface;

a plurality of walls protruding from the first surface of the base portion, each one of the plurality of walls including an end surface that faces away from the base portion; and a cavity between the plurality of walls;

a first die within the cavity and on the first surface of the base portion;

a second die in the cavity and on the first surface of the base portion;

a first wirebond having a first end coupled to the first die and a second end coupled to the base portion; and a silicone-based transparent resin within the cavity, the silicone-based transparent resin encasing the first die, the first wirebond, and the second die.

2. The device of claim 1, wherein the end surfaces of the plurality of walls are bare.

3. The device of claim 2, wherein the silicone-based transparent resin includes a surface that is transverse to the plurality of walls, and the surface of the silicone-based transparent resin extends between opposite ones of the plurality of walls.

4. The device of claim 3, wherein:

the silicone-based transparent resin further includes a first thickness that extends from the first surface of the base portion to the surface of the silicone-based transparent resin; and the plurality of walls have a second thickness that extends from the end surfaces of the first surface of the base portion to the plurality of end surfaces of the walls, the second thickness being greater than the first thickness.

5. The device of claim 4, wherein the surface of the silicone-based transparent resin is in closer proximity to the first surface of the base substrate relative to the plurality of end surfaces of the plurality of walls.

6. The device of claim 1, further comprising a second wirebond having a third end coupled to the second die and a fourth end opposite the third end coupled to the base portion of the substrate.

7. The device of claim 1, wherein the silicone-based transparent resin covers the end surfaces of the plurality of walls.

8. The device of claim 7, wherein the silicone-based transparent resin includes:

a first portion in the cavity having a first thickness; and a second portion on the first portion and on the end surfaces of the plurality of walls, the second portion having a second thickness less than the first thickness.

9. The device of claim 8, wherein:

the second thickness is less than or equal to 500-microns; and the first thickness is less than or equal to 100-microns.

10. The device of claim 8, wherein:

the plurality of walls include a plurality of external sidewalls and a plurality of internal sidewalls, the plurality of internal sidewalls delimiting the cavity, and the plurality of internal sidewalls are opposite to the plurality of external sidewalls; and the second portion of the transparent resin including a plurality of sidewalls, each one of the plurality of sidewalls of the second portion being coplanar or flush with a corresponding external surface of the plurality of external surfaces of the plurality of walls.

11. The device of claim 1, wherein the plurality of walls are along singulation lines.

12. A device, comprising:

a base portion with a first surface and a second surface opposite to the first surface;

a plurality of walls on the first surface, the plurality of walls protrude outward from the first surface, and each respective wall of the plurality of walls has an end surface that faces away from the base portion;

a recess defined by a first surface of the base portion and the plurality of walls, and the recess is surrounded by the plurality of walls;

a first die within the recess and on the first surface of the base portion;

a second die within the recess and on the first surface of the base portion;

a first wirebond having a first end coupled to the first die and a second end coupled to the base portion;

a silicon-based transparent resin within the recess, the silicon transparent resin encasing the first die, the second die, and the first wirebond, the silicon-based transparent resin includes an exposed surface that faces away from the base portion and overlaps the first die and the second die, and the silicon-based transparent resin covers the end surfaces of the plurality of walls.

13. The device of claim 12, wherein the exposed surface of the silicon-based transparent resin is further from the base portion that the end surfaces of the plurality of walls.

14. The device of claim 12, wherein the plurality of walls are along singulation lines.

15. The device of claim 12, wherein the base portion further includes a plurality of contact pads on the second surface of the base portion and a plurality of vias that extend throughout the base portion, and the plurality of vias are coupled to the plurality of contact pads.

16. A device, comprising:

a base portion with a first surface and a second surface opposite to the first surface;

a plurality of walls on the first surface, the plurality of walls protrude outward from the first surface, and each respective wall of the plurality of walls has an end surface that faces away from the base portion;

a recess defined by a first surface of the base portion and the plurality of walls, and the recess is surrounded by the plurality of walls;

a first die within the recess and on the first surface of the base portion;

a second die within the recess and on the first surface of the base portion;

a first wirebond having a first end coupled to the first die and a second end coupled to the base portion;

a silicon-based transparent resin within the recess, the silicon transparent resin encasing the first die, the second die, and the first widrebond, the silicon-based transparent resin includes an exposed surface that faces away from the base portion and overlaps the first die and the second die, and the exposed surface is recessed relative to the end surfaces of the plurality of walls.

17. The device of claim 16, wherein the end surfaces of the plurality of walls are further from the base portion than the exposed surface of the silicon-based transparent resin.

18. The device of claim 16, wherein the plurality of walls are along singulation lines.

19. The device of 16, wherein the base portion further includes a plurality of contact pads on the second surface of the base portion.

20. The device of claim 19, wherein the base portion further includes a plurality of vias that extend throughout the base portion, and the plurality of vias are coupled to the plurality of contact pads.

* * * * *